United States Patent [19]
Asaka

[11] Patent Number: 6,070,258
[45] Date of Patent: May 30, 2000

[54] LOGIC SYNTHESIS FOR TESTABILITY SYSTEM WHICH ENABLES IMPROVEMENT IN TESTABILITY AND EFFECTIVE SELECTION OF CENTER STATE AND LOGIC SYNTHESIS METHOD THEREOF

[75] Inventor: Toshiharu Asaka, Tokyo, Japan

[73] Assignee: NEC Corporation, Tokyo, Japan

[21] Appl. No.: 09/035,816

[22] Filed: Mar. 6, 1998

[30] Foreign Application Priority Data

Mar. 7, 1997 [JP] Japan ................................. 9-053554

[51] Int. Cl.[7] .................................................. G01R 31/28
[52] U.S. Cl. .................... 714/724; 714/718; 395/500.03; 395/500.05; 395/500.07
[58] Field of Search ................................. 714/724–727, 714/718, 733, 734; 395/500.03–500.19

[56] References Cited

U.S. PATENT DOCUMENTS

| | | | |
|---|---|---|---|
| 4,720,672 | 1/1988 | Turino | 340/825.62 |
| 5,097,151 | 3/1992 | Eerenstein et al. | 326/46 |
| 5,228,040 | 7/1993 | Agrawal et al. | 714/724 |
| 5,461,573 | 10/1995 | Chakradhar et al. | 395/500.05 |
| 5,515,292 | 5/1996 | Roy et al. | 395/500.03 |
| 5,877,905 | 3/1999 | Hieter et al. | 395/500.07 |

FOREIGN PATENT DOCUMENTS 2865136 12/1998 Japan.

OTHER PUBLICATIONS

Frank F. HSU et al., "A Distance Reduction Approach to Design for Testability", 1995, pp. 158–163.

Primary Examiner—Emmanuel L. Moise
Attorney, Agent, or Firm—Foley & Lardner

[57] ABSTRACT

A logic synthesis for testability system including a testability improving unit which employs a center state of an FSM of a circuit as a target for logic synthesis to reduce a distance between predetermined states for improving testability of the circuit expressed by the FSM which is held in a storage unit, the testability improving unit including a center state candidate selecting unit for excluding an asynchronous reset state and a predetermined state with a short distance from the asynchronous reset state from center state candidates and a center state selecting unit for sequentially selecting states not excluded by the center state candidate selecting unit as center state candidates, thereby conducting optimization processing taking testability into consideration during logic circuit designing.

22 Claims, 31 Drawing Sheets

FIG. 5

|   | A | B | C | D | E | F |
|---|---|---|---|---|---|---|
| A | 1 | 1 | 1 | 1 | 2 | 2 |
| B | 1 | 1 | 2 | 2 | 1 | 3 |
| C | 1 | 2 | 1 | 2 | 1 | 3 |
| D | 1 | 2 | 2 | 1 | 3 | 1 |
| E | 1 | 2 | 2 | 2 | 1 | 3 |
| F | 1 | 2 | 1 | 2 | 2 | 1 |

AVERAGE DISTANCE = 1.61

FIG. 7

|   | E | F |
|---|---|---|
| E | 1 | 3 |
| F | 2 | 1 |

FIG. 8

|   | E | F | SUM |
|---|---|---|-----|
| E | 0 | 3 | 3   |
| F | 2 | 0 | 2   |

FIG. 10

|   | A | B | C | D | E | F |
|---|---|---|---|---|---|---|
| A | 1 | 1 | 1 | 1 | 2 | 1 |
| B | 1 | 1 | 2 | 2 | 1 | 1 |
| C | 1 | 2 | 1 | 2 | 1 | 1 |
| D | 1 | 2 | 2 | 1 | 3 | 1 |
| E | 1 | 2 | 2 | 2 | 1 | 1 |
| F | 1 | 2 | 1 | 2 | 2 | 1 |

AVERAGE DISTANCE = 1.41

FIG. 11

| STATE | FF2509 | FF2510 | FF2511 | |
|---|---|---|---|---|
| A | 0 | 0 | 0 | 1101 |
| B | 0 | 1 | 0 | 1102 |
| C | 0 | 1 | 1 | 1103 |
| D | 1 | 0 | 0 | 1104 |
| E | 0 | 0 | 1 | 1105 |
| F | 1 | 1 | 0 | 1106 |
| UNUSED | 1 | 0 | 1 | 1107 |
| UNUSED | 1 | 1 | 1 | 1108 |

FIG. 12

| EXTERNAL INPUT | FF OUTPUT LOGICAL VALUE | | FF DATA INPUT LOGICAL VALUE | EXTERNAL OUTPUT | |
|---|---|---|---|---|---|
| 00 | 000 | : | 000 | 00 | 1201 |
| 01 | 000 | : | 010 | 01 | 1202 |
| 10 | 000 | : | 011 | 10 | 1203 |
| 11 | 000 | : | 100 | 11 | 1204 |
| -0 | 010 | : | 010 | 00 | 1205 |
| -1 | 010 | : | 001 | 11 | 1206 |
| 0- | 011 | : | 011 | 00 | 1207 |
| 1- | 011 | : | 001 | 10 | 1208 |
| -0 | 100 | : | 100 | 00 | 1209 |
| -1 | 100 | : | 110 | 01 | 1210 |
| 0- | 001 | : | 001 | 00 | 1211 |
| 1- | 001 | : | 000 | 11 | 1212 |
| -0 | 110 | : | 110 | 00 | 1213 |
| -1 | 110 | : | 011 | 10 | 1214 |
| - - | 101 | : | - - - | - - - | 1215 |
| - - | 111 | : | - - - | - - - | 1216 |

FIG. 14

| CENTER STATE CONTROLLING EXTERNAL INPUT | EXTERNAL INPUT | FF OUTPUT LOGICAL VALUE | FF DATA INPUT LOGICAL VALUE | EXTERNAL OUTPUT | |
|---|---|---|---|---|---|
| 0 | 00 | 000 | 000 | 00 | 1401 |
| 0 | 01 | 000 | 010 | 01 | 1402 |
| 0 | 10 | 000 | 011 | 10 | 1403 |
| 0 | 11 | 000 | 100 | 11 | 1404 |
| 0 | -0 | 010 | 010 | 00 | 1405 |
| 0 | -1 | 010 | 001 | 11 | 1406 |
| 0 | 0- | 011 | 011 | 00 | 1407 |
| 0 | 1- | 011 | 001 | 10 | 1408 |
| 0 | -0 | 100 | 100 | 00 | 1409 |
| 0 | -1 | 100 | 110 | 01 | 1410 |
| 0 | 0- | 001 | 001 | 00 | 1411 |
| 0 | 1- | 001 | 000 | 11 | 1412 |
| 0 | -0 | 110 | 110 | 00 | 1413 |
| 0 | -1 | 110 | 011 | 10 | 1414 |
| 0 | ⋮ | 101 | ⋮ | ⋮ | 1415 |
| 0 | ⋮ | 111 | ⋮ | ⋮ | 1416 |
| 1 | ⋮ | ⋮ | 110 | ⋮ | 1417 |

FIG. 19

|   | A | B | C | D | E | F |
|---|---|---|---|---|---|---|
| A | 1 | 1 | 2 | 3 | 3 | 3 |
| B | 1 | 1 | 1 | 2 | 2 | 2 |
| C | 1 | 2 | 1 | 1 | 1 | 1 |
| D | 1 | 2 | 1 | 1 | 2 | 2 |
| E | 1 | 2 | 1 | 2 | 1 | 1 |
| F | 1 | 2 | 1 | 2 | 2 | 1 |
| SUM OF DISTANCES FROM OTHER STATES | 5 | 9 | 6 | 10 | 10 | 9 |

AVERAGE DISTANCE = 1.52

FIG. 21

|   | A | B | C | D | E | F |
|---|---|---|---|---|---|---|
| A | 1 | 1 | 2 | 3 | 1 | 2 |
| B | 1 | 1 | 1 | 2 | 1 | 2 |
| C | 1 | 2 | 1 | 1 | 1 | 1 |
| D | 1 | 2 | 1 | 1 | 1 | 2 |
| E | 1 | 2 | 1 | 2 | 1 | 1 |
| F | 1 | 2 | 1 | 2 | 1 | 1 |

AVERAGE DISTANCE = 1.36

FIG. 24
(PRIOR ART)

| EXTERNAL INPUT | CURRENT STATE | NEXT STATE | EXTERNAL OUTPUT | |
|---|---|---|---|---|
| 00 | A | A | 00 | 2401 |
| 01 | A | B | 01 | 2402 |
| 10 | A | C | 10 | 2403 |
| 11 | A | D | 11 | 2404 |
| -0 | B | B | 00 | 2405 |
| -1 | B | E | 11 | 2406 |
| 0- | C | C | 00 | 2407 |
| 1- | C | E | 10 | 2408 |
| -0 | D | D | 00 | 2409 |
| -1 | D | F | 01 | 2410 |
| 0- | E | E | 00 | 2411 |
| 1- | E | A | 11 | 2412 |
| -0 | F | F | 00 | 2413 |
| -1 | F | C | 10 | 2414 |

(NOTE: "-" DENOTES THAT IT MAY BE '0' OR '1')

FIG. 26
(PRIOR ART)

|   | A | B | C | D | E | F |
|---|---|---|---|---|---|---|
| A | 1 | 1 | 1 | 1 | 2 | 2 |
| B | 2 | 1 | 3 | 3 | 1 | 4 |
| C | 2 | 3 | 1 | 3 | 1 | 4 |
| D | 4 | 5 | 2 | 1 | 3 | 1 |
| E | 1 | 2 | 2 | 2 | 1 | 3 |
| F | 3 | 4 | 1 | 4 | 2 | 1 |

AVERAGE DISTANCE = 2.16

FIG. 27
(PRIOR ART)

|   | A | B | C | D | E | F | SUM |
|---|---|---|---|---|---|---|-----|
| A | 0 | 1 | 1 | 1 | 2 | 2 | 7 |
| B | 2 | 0 | 3 | 3 | 1 | 4 | 13 |
| C | 2 | 3 | 0 | 3 | 1 | 4 | 13 |
| D | 4 | 5 | 2 | 0 | 3 | 1 | 15 |
| E | 1 | 2 | 2 | 2 | 0 | 3 | 10 |
| F | 3 | 4 | 1 | 4 | 2 | 0 | 14 |

FIG. 29
(PRIOR ART)

| CENTER STATE CONTROLLING EXTERNAL INPUT | EXTERNAL INPUT | CURRENT STATE | NEXT STATE | EXTERNAL OUTPUT | |
|---|---|---|---|---|---|
| 0 | 00 | A | A | 00 | 2901 |
| 0 | 01 | A | B | 01 | 2902 |
| 0 | 10 | A | C | 10 | 2903 |
| 0 | 11 | A | D | 11 | 2904 |
| 0 | -0 | B | B | 00 | 2905 |
| 0 | -1 | B | E | 11 | 2906 |
| 0 | 0- | C | C | 00 | 2907 |
| 0 | 1- | C | E | 10 | 2908 |
| 0 | -0 | D | D | 00 | 2909 |
| 0 | -1 | D | F | 01 | 2910 |
| 0 | 0- | E | E | 00 | 2911 |
| 0 | 1- | E | A | 11 | 2912 |
| 0 | -0 | F | F | 00 | 2913 |
| 0 | -1 | F | C | 10 | 2914 |
| 1 | -- | A | A | -- | 2915 |
| 1 | -- | B | A | -- | 2916 |
| 1 | -- | C | A | -- | 2917 |
| 1 | -- | D | A | -- | 2918 |
| 1 | -- | E | A | -- | 2919 |
| 1 | -- | F | A | -- | 2920 |

FIG. 31
(PRIOR ART)

|   | A | B | C | D | E | F |
|---|---|---|---|---|---|---|
| A | 1 | 1 | 1 | 1 | 2 | 2 |
| B | 1 | 1 | 2 | 2 | 1 | 3 |
| C | 1 | 2 | 1 | 2 | 1 | 3 |
| D | 1 | 2 | 2 | 1 | 3 | 1 |
| E | 1 | 2 | 2 | 2 | 1 | 3 |
| F | 1 | 2 | 1 | 2 | 2 | 1 |

AVERAGE DISTANCE = 1.16

FIG. 37
(PRIOR ART)

|   | A | B | C | D | E | F |
|---|---|---|---|---|---|---|
| A | 1 | 1 | 2 | 3 | 3 | 3 |
| B | 1 | 1 | 1 | 2 | 2 | 2 |
| C | 1 | 2 | 1 | 1 | 1 | 1 |
| D | 1 | 2 | 1 | 1 | 2 | 2 |
| E | 1 | 2 | 1 | 2 | 1 | 1 |
| F | 1 | 2 | 1 | 2 | 2 | 1 |
| SUM OF DISTANCES FROM OTHER STATES | 5 | 9 | 6 | 10 | 10 | 9 |

AVERAGE DISTANCE = 1.52

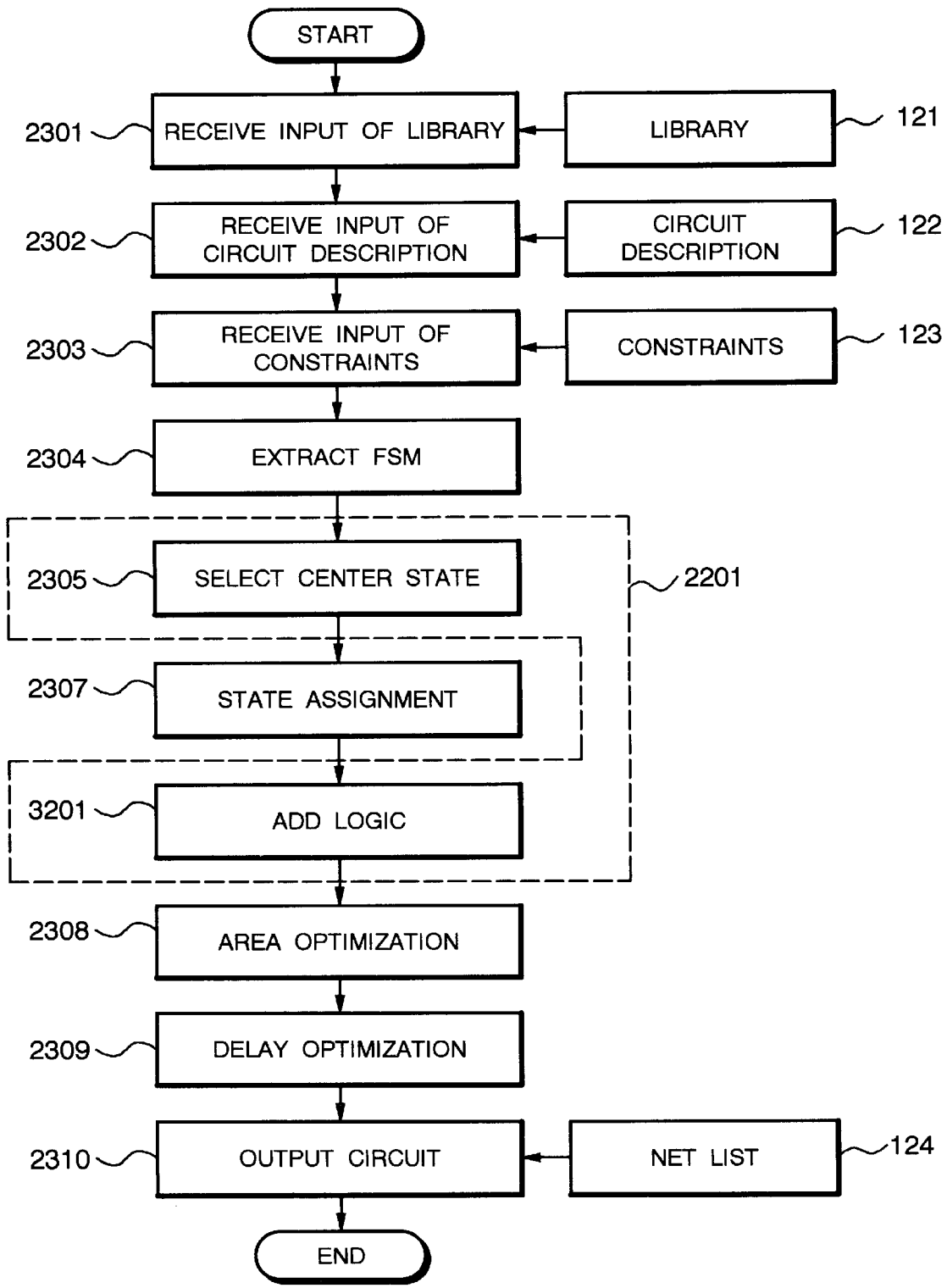

FIG. 38
(PRIOR ART)

|   | A | B | C | D | E | F |
|---|---|---|---|---|---|---|
| A | 1 | 1 | 1 | 2 | 2 | 2 |
| B | 1 | 1 | 1 | 2 | 2 | 2 |
| C | 1 | 2 | 1 | 1 | 1 | 1 |
| D | 1 | 2 | 1 | 1 | 2 | 2 |
| E | 1 | 2 | 1 | 2 | 1 | 1 |
| F | 1 | 2 | 1 | 2 | 2 | 1 |

AVERAGE DISTANCE = 1.41

FIG. 39
(PRIOR ART)

|   | A | B | C | D | E | F |
|---|---|---|---|---|---|---|
| A | 1 | 1 | 2 | 3 | 1 | 2 |
| B | 1 | 1 | 1 | 2 | 1 | 2 |
| C | 1 | 2 | 1 | 1 | 1 | 1 |
| D | 1 | 2 | 1 | 1 | 1 | 2 |
| E | 1 | 2 | 1 | 2 | 1 | 1 |
| F | 1 | 2 | 1 | 2 | 1 | 1 |

AVERAGE DISTANCE = 1.36

LOGIC SYNTHESIS FOR TESTABILITY SYSTEM WHICH ENABLES IMPROVEMENT IN TESTABILITY AND EFFECTIVE SELECTION OF CENTER STATE AND LOGIC SYNTHESIS METHOD THEREOF

BACKGROUND OF THE INVENTION

1. Field of the Invention

The present invention relates to a logic synthesis for testability system which enables improvement in testability of a finite state machine (FSM) having an asynchronous reset state and also testability of an FSM having a state with a short distance from other state, and a logic synthesis method thereof.

2. Description of the Related Art

Unlike such design for testability as represented by the scan method in which testability of a logic circuit is enhanced after the designing of the logic circuit, a logic synthesis for a testability system is a system which executes optimization processing taking testability into consideration during logic circuit designing, that is, during logic synthesis, thereby synthesizing logic of a circuit which will have lower area overhead and a higher fault coverage than those achieved by design for testability methods and facilitate test-pattern generation.

One of conventional logic synthesis for testability systems is, for example, a system using a center state of a finite state machine (FSM) disclosed in "A Distance Reduction Approach to Design for Testability" (F. F. Hsu and J. H. Patel, The 13th IEEE VLSI Test Symposium, pp. 158–163, Apr. 30–May 3, 1995). In this system, a mean value of distances between all pairs of states is used as a testability measure of FSMs. A distance between pairs of states, assuming a pair of two states, a current state and a final transition goal state, is represented as a minimum number of clocks necessary for a transition from the current state to the final transition goal state. Being small in number denotes that the distance is short and Large in number denotes that the distance is long.

The reason why a mean value of distances can be a testability measure of an FSM is that a test-pattern length of a sequential circuit synthesized by FSMs depends on a distance between states. A test-pattern of a sequential circuit is made up by the repetition of a set of three sequences, a justification sequence, a fault activation sequence and a distinguish sequence. The justification sequence is an input pattern sequence for causing an internal state of a sequential circuit to transfer from a current internal state to an internal state required by the fault activation sequence. The fault activation sequence is an input pattern for propagating effects of faults to flip-flops (FFs) or external output terminals. The distinguish sequence is an input pattern sequence for propagating effects of faults propagated to FFs by the fault activation sequence to external output terminals. An internal state of a sequential circuit is denoted by a binary logical value vector held by FFs in the sequential circuit. With a sequential circuit having two FFs, for example, binary logical value vectors held by the FFs are four kinds, "00", "01", "10" and "11", each of which represents one internal state. When an internal state required by the fault activation sequence is equal to the current internal state, no justification sequence is necessary. When effects of faults are propagated to external output terminals by the fault activation sequence, no distinguish sequence is necessary. Since one state of an FSM corresponds to one internal state of the sequential circuit, transition of an internal state caused by the justification sequence is equivalent to transition of a state of the FSM.

Length of the justification sequence is therefore depends on a distance between states of an FSM, and reduction in distance between states of the FSM accordingly has the effect of reducing a justification sequence length and a sequential circuit test-pattern length. When a sequential circuit automatic test-pattern generation program is applied to a sequential circuit requiring a long justification sequence, test-pattern generation costs enormous time. Therefore, with a limitation put on a program execution time, if a fault occurs which costs much time for generating a test-pattern sequence, generation of a test-pattern for the fault might be interrupted midway in the processing to shift the processing to that for the generation of a test-pattern for another fault, whereby the number of faults detected is reduced to prevent acquisition of a satisfactory fault coverage in some cases. When a distance between states of an FSM is reduced, therefore, a resultant circuit obtained by logic synthesis is allowed to generate a test-pattern with a short sequence length and a high fault coverage in a short time period. An FSM with a small average distance value can be said to have high testability.

The logic synthesis for testability system using a center state, by regarding a state with the smallest sum of distances to other states as a center state and taking advantage of a distance from the center state to other states being short, adds a transition from each state to the center state to an FSM to generate a short path via the center state, thereby reducing a distance between pairs of states having a long state-to-state distance to synthesize a sequential circuit which can be tested with ease. Consider three states ST1, ST2 and ST3 in a predetermined FSM. It is assumed that a distance from ST1 to ST3 is "1", a distance from ST2 to ST3 is "3" and a distance from ST2 to ST1 is equal to or more than "2". Here, addition of a path, that is a transition, with a distance of "1" from ST2 to ST1 generates a path with a distance of "2" from ST2 to ST3 via ST1, resulting in reduction of the distance. This is a principle of distance reduction using a center state.

Next, a conventional logic synthesis for testability system will be detailed with reference to accompanying drawings. Although FSMs are classified into those of Mealy machine whose external output logical vecter is determined by a current state and an external input logical vecter and those of Moore machine whose external output logical value is determined only by a current state, a Moore machine FSM can be regarded as being of Mealy machine whose external output logical value is not dependent on an external input logical value and therefore description will be made with respect to a Mealy machine FSM.

FIG. 22 is a block diagram showing the entire structure of a conventional logic synthesis for a testability system. With reference to FIG. 22, the conventional logic synthesis for the testability system includes a library input unit 102 for reading a technology library for use in technology mapping and holding the same in a storage unit 101, a circuit input unit 103 for reading a description of a circuit as a target for logic synthesis and holding the same in the storage unit 101, a constraint input unit 104 for reading constraints such as area and delay and holding the same in the storage unit 101, an FSM extracting unit 105 for extracting an FSM when a circuit held in the storage unit 101 is expressed in a form other than a FSM, a testability improving unit 2201 for improving testability of a circuit represented by an FSM which is held in the storage unit 101, a state assignment unit 107 for assigning a binary logical value vector to a state of a circuit represented by an FSM which is held in the storage unit 101, an area optimization unit 108 for optimizing the area of a circuit held in the storage unit 101, a delay optimization unit 109 for optimizing the delay of a circuit held in the storage unit 101, a circuit output unit 110 for outputting a logic synthesis resultant circuit held in the storage unit 101, and the storage unit 101 for holding a circuit as a target for logic synthesis, a technology library and constraints. The testability improving unit 2201 includes a center state selecting unit 112 for selecting a center state among all states of an FSM as candidates, a transition adding unit 113 for adding a transition to a center state to an FSM, and a logic adding unit 114 for adding a logic circuit for generating a binary logical value vector assigned to a center state to a circuit whose states have been assigned.

Next, description will be made of operation of a conventional logic synthesis for testability system with reference to a flow chart shown in FIG. 23. FIG. 23 is a flow chart showing operation of a conventional logic synthesis for testability system. First, the library input unit 102 reads a technology library 121 and holds the same in the storage unit 101 (Step 2301), the circuit input unit 103 reads a circuit description 122 and holds the same in the storage unit 101 (Step 2302) and the constraints input unit 104 reads a constraint condition 123 and holds the same in the storage unit 101 (Step 2303). Next, the FSM extracting unit 105 extracts an FSM and holds the same in the storage unit 101 when the circuit held in the storage unit 101 is expressed in a form other than a FSM (Step 2304). Then, the center state selecting unit 112 of the testability improving unit 2201 selects a center state (Step 2305) and the transition adding unit 113 adds a transition from each state to the center state (Step 2306). Next, the state assignment unit 107 assigns a binary logical value vector to a state of the FSM held in the storage unit 101 (Step 2307). Then, the area optimization unit 108 conducts such area optimization independent of the technology library 121 as a two-level logic optimization or logic multi-level and area optimization technology mapping dependent on a technology using the technology library 121 (Step 2308). Next, the delay optimization unit 109 conducts delay optimization independent of the technology library 121 and delay optimization technology mapping dependent on a technology using the technology library 121 with respect to the circuit held in the storage unit 101 such that the designated constraint condition 123 is satisfied (Step 2309). Lastly, the circuit output unit 110 outputs a net list 124 of a logic synthesis resultant circuit held in the storage unit 101 (Step 2310).

Next, operation of the testability improving unit 2201 of the conventional logic synthesis for testability system will be described in detail. FIG. 24 is a state transition table of an FSM as a target for the testability improving unit 2201 which has no asynchronous reset state and is composed of two external input terminals, two external output terminals and six states, while FIG. 25 is a state transition graph of the FSM illustrated in FIG. 24. In FIG. 25, signs 301 to 306 denote states of the FSM and signs 307 to 320 denote transitions between transition states. Numeric values partitioned by a symbol "/" which are indicated near transition are an external input logical value as a condition for the occurrence of the transition and an external output logical value at the time of the occurrence of the transition. They are described in the form of "external input logical value/ external output logical value". In FIG. 25, a transition 309, for example, denotes that if a logical value "01" is applied to the external input terminal when the current state is a state A301, transition to a state B302 occurs at the application of a next clock, whereby a logical value "01" is output to the external output terminal. The transition 309 is equivalent to a transition 2402 in the state transition table shown in FIG. 24. These relationships are established also for other states and transitions.

The operation of the center state selecting unit 112 is explained as follows. In the state-to-state distance calculation processing, the center state selecting unit 112 obtains distances between pairs of states. Obtained results are shown in FIG. 26. With reference to FIG. 26, since transition from the state A301 to the state B302 is made via the transition 309 in one clock, a value in the matrix in the A row, the B column in FIG. 26 will be "1". Since from the state A301 to a state E305, the shortest path is made in two clocks by a transfer to the state B302 via the transition 309 and then a transfer to the state E305 via a transition 312, a value in the matrix in the A row, the E column in FIG. 26 will be "2". Distances between the other states will be obtained in the same manner.

A mean value of thus obtained state-to-state distances is "2.16". Next, in the own distance resetting processing, a distance to its own state is set to "0". The results are shown in FIG. 27. Comparison between FIGS. 26 and 27 shows that the value in the matrix in the A row, the A column is "0" and as to the other states, values in the matrices in the same row, the same column are "0". Next, in the sum of distances calculation processing, a sum of distances from each state to other states is obtained. The results are shown in the column of SUM in FIG. 27. For example, a sum of distances from the state A301 to the other states is "7". Lastly, in the center state determination processing, a state with a smallest sum of distances to other states is selected as a center state. Based on the results shown in FIG. 27, the state A301 with the smallest sum is selected as a center state.

Next, the transition adding unit 113 adds a transition from every state to the center state and adds testability obtained by a distance reduction. FIG. 28 is a flow chart showing operation of the transition adding unit 113. With reference to FIG. 28, first in the center state controlling external input terminal adding processing at Step 2801, the unit 113 adds a center state controlling external input terminal to a circuit. The center state controlling external input terminal is an external input terminal for controlling a transition of an FSM, and when one of binary logical values is applied to the center state controlling external input terminal, the same transition as that of the original FSM takes places according to a logical value of other external input terminal and when the other of the binary logical values is applied, transition to the center state occurs regardless of a logical value of other external input terminal. The center state controlling external input terminal is here designated such that when a logical value of the center state controlling external input terminal is "0", the same transition as that of the original FSM occurs and when the logical value is "1", a transition to the center state occurs. Next, in the transition condition modifying processing at Step 2802, a logical value of an external input terminal as a transition condition is modified. More specifically, the logical value "0" of the center state controlling external input terminal causing the same transition as that of the original FSM is added to a logical value of the external input terminal as a transition condition. Lastly, in the processing for adding a transition to center state at Step 2803, a transition is added such that when the logical value of the center state controlling external input terminal is "1", a transition to the center state will occur regardless of a logical value of other external input terminal.

FIG. 29 is a state transition table of an FSM obtained after the completion of the processing by the transition adding unit 113, while FIG. 30 is a state transition graph of the FSM. The matrices with signs 2901 to 2914 in FIG. 29 denote transitions 2401 to 2414 each having a logical value of the center state controlling external input terminal added to transition conditions, while the matrices with signs 2915 to 2920 denote an added transition to the center state. A sign 3001 in FIG. 30 represents a transition 307 with a condition for a transition to the center state and a logical value of the center state controlling external input terminal added to transition conditions, while signs 3002 to 3010 represent transitions 308 to 316 each having a logical value of the center state controlling external input terminal added to transition conditions. A sign 3015 represents a transition 371 with a condition for a transition to the center state and a logical value of the center state controlling external input terminal added to transition conditions. Signs 3016 to 3018 represent transitions 318 to 320 each having a logical value of the center state controlling external input terminal added to transition conditions.

The transition 2402 is changed into the transition 2902 by the processing at Step 2801. The transition 2902 is obtained by adding a condition that a logical value of the center state controlling external input terminal is "0" to the transition 2402. The transition 2902 is equivalent to the transition 3003 in FIG. 30. This is also the case with other transitions. The transitions 2915 to 2920 are added by the processing at Step 2802.

The transition 2916 denotes that a transition to the state A301 selected as the center state occurs when the logical value of the center state controlling external input terminal is "1" at the current state of the state B302. This is also the case with other transitions. While a logical value of the external output terminal at the time of a transition to the center state is not particularly designated here but regarded as "don't care", some logical value may be designated. When the logical value is designated to be "don't care", an output logical value will be assigned later by the area optimization unit 108. In addition, the transition 2916 is equivalent to the transition 3015 in FIG. 30.

Since the transition 2901 and the transition 2915 have a current state and a next state coincident with each other, they are unitarily indicated as the transition 3001 in the state transition graph shown in FIG. 30. The transition 2912 and the transition 2919 are also unitarily indicated as the transition 3011 in FIG. 30.

For the purpose of confirming the effects of the above-described processing, results of the state-to-state distances obtained with respect to the FSM which is obtained based on FIG. 29 are shown in FIG. 31. For example, a distance from the state B304 to the state B302 indicated in the matrix in the D row, the B column in FIG. 26 is "5", while a distance indicated in the matrix in the D row, the B column in FIG. 31 is "2", which shows a distance reduction achieved by the addition of a transition to the center state. As to an average distance value, it is "2.16" in FIG. 26, while it is "1.16" in FIG. 31, which allows reduction in distance and improvement in testability to be confirmed.

Next, description will be made of operation of a conventional logic synthesis for testability system using the logic adding unit 114 which realizes the effect equivalent to that of adding a transition to the center state to an FSM by adding a logic circuit to a sequential circuit in which states of an FSM have been assigned. FIG. 32 is a flow chart showing operation of the conventional logic synthesis for testability system using the logic adding unit 114. The operation illustrated in the flow chart of FIG. 32, unlike the operation of the system using the transition adding unit 113 shown in the flow chart of FIG. 23, applies the state assignment unit 107 after the application of the center state selecting unit 112 (Steps 2305 and 2307) and then applies the logic adding unit 114 (Step 3201) but not the transition adding unit 113.

Next, operation of the conventional logic synthesis for testability system using the logic adding unit 114 will be described in detail. Since operation up to the processing by the center state selecting unit 112 at Step 2305 is the same as that of the system applying the transition adding unit 113 which has been described with reference to FIG. 23, no description will be made of the operation. In the processing at step 2307, the state assignment unit 107 assigns a binary logical value vector indicative of an internal state to each state. Since state assignment is a well-known technique, no description will be made thereof.

FIG. 33 is a diagram showing a sequential circuit obtained as a result of the processing by the state assignment unit 107. Three FFs are generated for representing six states. This is because the number of internal states expressible by FFs is 2 multiplied by the number of FFs and therefore the minimum number of FFs which can represent six states is three. As shown in FIG. 33, by the state assignment unit 107, the FSM is converted into a sequential circuit represented by a combinational circuit 3301 for receiving input of a logical value of an external input terminal 3312 and input of FF output logical values 3305 to 3307 to generate a logical value of an external output terminal 3313 and FF data input logic 3308 to 3310, FFs 3302 to 3304 for holding an internal state, FF output logical values 3305 to 3307, FF data input logic 3308 to 3310 for generating each bit of an internal state as an input logical value of an FF, a clock 3311 for FFs, the external input terminal 3312 and the external output terminal 3313.

FIG. 34 is a flow chart showing operation of the logic adding unit 114, while FIG. 35 is a sequential circuit obtained as a result of the application of the logic adding unit 114 to the sequential circuit illustrated in FIG. 33. It is assumed that to the state A301 selected by the center state selecting unit 112, a binary logical value vector "010" has been assigned as an internal state by the state assignment unit 107. In other words, a case where the logical value held by the FF3302 is "0", the logical value held by the FF3303 is "1" and the logical value held by the FF3304 is "0" is equivalent to the state A301. The effect equivalent to that produced by adding a transition to a center state can be therefore obtained by modifying the circuit such that when the logical value "0" is applied to the center state controlling input terminal, input logical values to the FFs 3302 to 3304 will be logical values of the FF data input logic 3308 to 3310 and when the logical value "1" is applied to the center state controlling input terminal, they will be represented by a binary logical value vector of "010".

With reference to FIG. 34, the logic adding unit 114 first adds the center state controlling external input terminal 3501 to the circuit (Step 3401). Then, determination is made whether an FF yet to be processed exists or not (Step 3402) and when there exists no FF yet to be processed, the processing by the logic adding unit 114 is completed. On the other hand, when there exist FFs yet to be processed, one of the FFs yet to be processed is extracted (Step 3403). It is assumed here that the FF3302 is first extracted. Next, determination is made which logical value of the center state is assigned to the FF (Step 3404) and when the logical value "0" is assigned, the routine proceeds to Step 3405 and when the logical value "1" is assigned, the routine proceeds to Step 3408. Since the logical value "0" is assigned to the FF3302, the routine proceeds to Step 3405 to determine whether a NOT element exists which generates reverse logic of the center state controlling external input terminal. Then, when a NOT element exists, the routine proceeds to Step 3407 and when no NOT element exists, the routine proceeds to Step 3407 via Step 3406. In this example, since no NOT element exists, the routine proceeds to Step 3406 to add a NOT element 3502 which generates reverse logic of the center state controlling external input terminal to the circuit and connect an input terminal of the NOT element 3502 with the center state controlling external input terminal 3501. Next, the unit 114 adds a two-input AND element 3503 and connects one input terminal of the element with the output terminal of the NOT element 3502 and the other input terminal with the FF data input logic 3308, disconnects the FF data input logic 3308 from the data input of the FF3302 and connects the output terminal of the two-input AND element 3503 to the data input terminal of the FF3302 (Step 3407). Thereafter, the routine returns to Step 3402. The foregoing modification results in that an input logical value to the data input terminal of the FF3302 will be expressed as "the center state controlling input terminal 3501\*the FF data input logic 3308 (\*denotes a logical product)", which enables a desired logical value to be applied to the FF3302.

Next, it is assumed that the FF3303 is selected at Step 3403. First, determination is made which logical value of the center state is assigned to the FF (Step 3404) and since the logical value "1" is assigned to the FF3303, the unit 114 adds a two-input OR element 3504, connects one input terminal of the element with the center state controlling external input terminal 3501 and the other input terminal with the FF data input logic 3309, disconnects the FF data input logic 3309 from the data input to the FF3303 and connects the output terminal of the two-input OR element 3504 to the data input terminal of the FF3303 (Step 3408). The foregoing modification results in that an input logical value to the data input terminal of the FF3303 will be expressed as "the center state controlling input terminal 3501+the FF data input logic 3309 (+denotes a logical sum)", which enables a desired logical value to be applied to the FF3303.

When the FF3304 is selected at Step 3303, processing is the same as that for the FF3302, except that the routine proceeds from Step 3405 directly to Step 3407 because the NOT element 3502 already exists, and therefore no description will be made of the processing here.

Although the foregoing description has been given of a case where a logic circuit which generates an internal state binary logical value vector assigned to a center state is implemented by using logic elements, it is also possible in actual application to use actual elements in the technology library 121 for use in technology mapping by the area optimization unit 108 and the delay optimization unit 109 or insert logic itself independent of the technology library 121.

In addition, although the description has been given of a case where the testability adding unit is executed immediately after the execution of the state assignment unit 107, logic synthesis may be conducted during the following execution of the area optimization unit 108 and the delay optimization unit 109 on condition that it is executed before the application of delay optimization which applies the re-timing technique of optimizing a delay by shifting an FF bridging over a combinational circuit. This is because re-timing alters the number of FFs and logic of FF data input in the circuit to lead to change of an internal state equivalent to an center state from a binary logical value vector assigned by the state assignment unit 107 to another binary logical value vector.

While the logic synthesis for testability system using a center state is directed to an FSM, it may be applied to an FSM extracted by the FSM extracting unit 105 from a sequential circuit expressed in other form than FSM such as a net list.

The above-described conventional logic synthesis for testability system has the following drawbacks.

The first drawback is that when an asynchronous reset state or a state with a short distance from the asynchronous reset state is selected as a center state, effects of testability improvement can not be obtained or if possible, the effects are very limited. The reason is that since the asynchronous reset state allows a transition from any state because of its function, state-to-state distances can not be reduced at all even by a new addition of a transition to the asynchronous reset state. Also as to a state with a short distance from the asynchronous reset state, since a path via the asynchronous reset state already exists, the effect of distance reduction is very little.

FIG. 3 is a state transition graph obtained in a case where the state A301 of the FSM shown in FIG. 25 is at an asynchronous reset state. An asynchronous reset transition 321 denotes that when an asynchronous reset control external input terminal RST has the logical value "1", transition to the state A301, which is an asynchronous reset state, occurs regardless of other external input terminals and clocks. Distances obtained with respect to this FSM are shown in FIG. 5. Although the number of clocks for a transition to the asynchronous reset state is "0", since one pattern is required for the transition, it is treated as requiring one clock, that is, as the distance of "1", for convenience. If selection of a center state is made here according to conventional art, the state A301 is selected as the center state. As a result, even the addition of a transition to the center state will not contribute to distance reduction and improvement in testability accordingly.

A second drawback is that when a state with a short distance from other states is selected as a center state, effects of testability improvement can not be obtained or if possible, the effects are very limited. The reason is that even if a transition to a state with a short distance from other states is newly added, reduction of state-to-state distances is slight because the distance is originally short.

FIG. 36 shows an FSM as a target for logic synthesis for testability. FIG. 37 shows results of state-to-state distances obtained in the FSM shown in FIG. 36, in which an average distance is "1.52". Application of the conventional logic synthesis for testability to this FSM results in selecting a state C3603 as a center state. Distances in the FSM obtained as a result of the addition of a transition to the state C3603 are shown in FIG. 38, in which an average distance is reduced to "1.41". FIG. 39 shows results of distances in the FSM illustrated in FIG. 36 which are obtained when a state E3605 is selected as the center state. In this case, the average distance is reduced down to "1.36", which is a greater reduction than that attained by the selection of any of the other states as a center state. The reason why the effect of distance reduction achieved by the state C3603 is smaller than that attained by the state E3605 is that since a distance from other state to the state C3603 is short, newly adding a transition from other state to the state C3603 to make the distance "1" will have little effect on distance reduction.

SUMMARY OF THE INVENTION

An object of the present invention is to provide a logic synthesis for testability system enabling more effective selection of a center state to improve testability of even an FSM having an asynchronous rest state and a logic synthesis method thereof.

Another object of the present invention is to provide a logic synthesis for testability system enabling more effective selection of a center state to improve testability of even an FSM having a state with a short distance from other state and a logic synthesis method thereof.

According to the first aspect of the invention, the logic synthesis for testability system which conducts optimization processing taking testability in logic circuit design using a technology library for use in technology mapping, description of a circuit as a target for logic synthesis and constraints such as area and delay, comprises FSM extracting means for extracting an FSM when the circuit is expressed in other form than FSM, testability means for improving testability of the circuit expressed by an FSM by using a center state of an FSM extracted by the FSM extracting means to reduce a distance between predetermined states, state assignment means for assigning a binary logical value vector to a state of the circuit expressed by an FSM, area optimization means for optimizing an area of the circuit, delay optimization means for optimizing a delay of the circuit, and circuit outputting means for outputting a circuit as a resultant of logic synthesis of the circuit which is conducted by the testability means, the state assignment means, the area optimization means and the delay optimization means, wherein the testability means comprising center state candidate selecting means for excluding an asynchronous reset state and a predetermined state with a short distance from the asynchronous reset state from center state candidates, center state selecting means for sequentially selecting, as a center state, the states not excluded by the center state candidate selecting means.

The center state candidate selecting means, when a value of a distance between targeted the state and the asynchronous reset state is smaller than a threshold value set based on predetermined rules, excludes the targeted state from center state candidates.

The center state candidate selecting means sets a maximum limit of the number of the states to be selected as center state candidates to sequentially select the states as center state candidates within the maximum limit, starting with the state with a long distance from the asynchronous reset state, and exclude the remainder of the states from center state candidates.

The center state candidate selecting means sets a maximum limit of the number of the states to be excluded from center state candidates to sequentially exclude the states from center state candidates within the maximum limit, starting with the state with a short distance from the asynchronous reset state.

In the preferred construction, the center state candidate selecting means excludes, from center state candidates, predetermined the state with a short distance from other the states as well as the asynchronous reset state and predetermined the state with a short distance from the asynchronous reset state.

In the preferred construction, with respect to predetermined the state, when a sum of distances between the state and the remainder of the states is smaller than a value obtained by multiplying an average value of distances between the state and the remainder of the states by the number of the remainder of the states, the center state candidate selecting means excludes the predetermined state as well as the asynchronous reset state and predetermined the state with a short distance from the asynchronous reset state from center state candidates.

In another preferred construction, the center state candidate selecting means sets a maximum limit of the number of the states to be excluded from center state candidates other than the asynchronous reset state and predetermined the state with a short distance from the asynchronous reset state to sequentially exclude the states from center state candidates within the maximum limit, starting with the state with a short distance from other the state.

In another preferred construction, with respect to predetermined the state, when a value of a distance between the state and each of all other the states is smaller than a threshold value set based on predetermined rules, the center state candidate selecting means excludes the predetermined state as well as the asynchronous reset state and predetermined the state with a short distance from the asynchronous reset state from center state candidates.

According to the second aspect of the invention, a method of synthesizing logic of a logic circuit which enables improvement in testability of an FSM by using a center state to reduce state-to-state distances, comprising the steps of:

determining whether an asynchronous reset state exists, regarding all of the states as center state candidates when the determination is made at the determination step that no asynchronous reset state exists and setting a threshold value based on predetermined rules when the determination is made that an asynchronous reset state exists, calculating distances between all of the states in the FSM and the asynchronous reset state, with respect to all of the states in the FSM, judging whether to select targeted the state as a center state candidate based on the state-to-state distance calculating step and a threshold value set at the threshold value setting step.

In the preferred construction, in the threshold value setting step, the threshold value is set according to a distance value from the asynchronous reset state, the center state candidate judging step, with respect to all of the states in the FSM, sequentially compares a distance between each state and the asynchronous reset state calculated at the state-to-state distance calculating step and a threshold value set at the threshold value setting step) to determine whether the state-to-state distance is long or short, and when the determination is made at the state-to-state distance determining step that the state-to-state distance is long, selects targeted the state as a center state candidate.

In the preferred construction, in the threshold value setting step, an average distance value between the asynchronous reset state and each of all other the states is set as the threshold value.

In the preferred construction, in the threshold value setting step, the threshold value is calculated by using a calculation expression employing the number of states.

In another preferred construction, in the threshold value setting step, a maximum limit of the number of the states to be selected as center state candidates is set as the threshold value, the center state candidate judging step sequentially selects the states as the center state candidates within the maximum limit, starting with the state with a long distance from the asynchronous reset state, and exclude the remainder of the states from the center state candidates.

In another preferred construction, in the threshold value setting step, a maximum limit of the number of the states to be excluded from center state candidates is set as the threshold value, the center state candidate judging step sequentially excludes the states from center state candidates within the maximum limit, starting with the state with a short distance from the asynchronous reset state.

According to the third aspect of the invention, a method of synthesizing logic of a logic circuit which enables improvement in testability of an FSM by using a center state to reduce state-to-state distances, comprising the steps of:

regarding all of the states as center state candidates to determine whether an asynchronous reset state exists among the states, when the determination is made at the determination step that an asynchronous reset state exists, excluding the asynchronous reset state from center state candidates and calculating a first threshold value based on predetermined rules, calculating distances between all of the states as center state candidates and the asynchronous reset state, with respect to all of the states in the FSM, judging whether to exclude targeted the state as a center state candidate based on the state-to-state distance calculating step and a threshold value set at the first threshold value setting step, calculating a second threshold value based on predetermined rules, with respect to all of the states as center state candidates, calculating each state-to-state distance, judging whether to exclude targeted the state as a center state candidate based on the second state-to-state distance calculating step and a threshold value set at the second threshold setting step.

In the preferred construction, in the first judging step, sequentially comparing in distance between each of the states and the asynchronous reset state calculated at the first state-to-state distance calculating step and a threshold value set at the first threshold value setting step to determine whether the state-to-state distance is long or short, and with respect to predetermined the state, when the determination is made at the state-to-state distance determining step that the state-to-state distance is short, excluding the state from center state candidates, in the second judging step, sequentially comparing a distance calculated between each of the states and the asynchronous reset state at the second state-to-state distance calculating step and a threshold value set at the second threshold setting step to determine whether the state-to-state distance is long or short, and with respect to predetermined the state, when the determination is made at the state-to-state distance determining step that the state-to-state distance is short, excluding the state from center state candidates.

In the preferred construction, in the second threshold value setting step, a value obtained by multiplying an average value of distances between the state and each of all other the states by the number of all other the states is set as the second threshold value, the second judging step excludes targeted the state from the center state candidates when a sum of distances between the state and the remainder of the states is smaller than the second threshold value.

In another preferred construction, in the second threshold value setting step, a maximum limit of the number of the states to be excluded from center state candidates is set as the threshold value, the second judging step excludes the states from center state candidates within the maximum limit, starting with the state with a short distance from the asynchronous reset state.

According to the fourth aspect of the invention, a computer readable memory storing a control program for controlling a logic synthesis for testability system which conducts optimization processing taking testability into consideration during designing of a logic circuit to employ a center state of an FSM in the logic circuit, thereby reducing a state-to-state distance to improve testability of the FSM, the control program comprising the steps of:

determining whether an asynchronous reset state exists, regarding all of the states as center state candidates when the determination is made at the determination step that no asynchronous reset state exists and setting a threshold value based on predetermined rules when the determination is made that an asynchronous reset state exists, calculating distances between all of the states in the FSM and the asynchronous reset state, with respect to all of the states in the FSM, judging whether to select targeted the state as a center state candidate based on the state-to-state distance calculating step and a threshold value set at the threshold value setting step.

According to another aspect of the invention, a computer readable memory storing a control program for controlling a logic synthesis for testability system which conducts optimization processing taking testability into consideration during designing of a logic circuit to employ a center state of an FSM in the logic circuit, thereby reducing a state-to-state distance to improve testability of the FSM, the control program comprising the steps of:

regarding all of the states as center state candidates to determine whether an asynchronous reset state exists among the states, when the determination is made at the determination step that an asynchronous reset state exists, excluding the asynchronous reset state from center state candidates and calculating a first threshold value based on predetermined rules, calculating distances between all of the states as center state candidates and the asynchronous reset state, with respect to all of the states in the FSM, judging whether to exclude targeted the state as a center state candidate based on the state-to-state distance calculating step and a threshold value set at the first threshold value setting step, calculating a second threshold value based on predetermined rules, with respect to all of the states as center state candidates, calculating each state-to-state distance, judging whether to exclude targeted the state as a center state candidate based on the second state-to-state distance calculating step and a threshold value set at the second threshold setting step.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 5 is a diagram showing state-to-state distances on the state transition graph of FIG. 3.

FIG. 7 is a diagram showing distances between all the states as center state candidates.

FIG. 8 is a diagram showing part-way progress of the center state selection processing.

FIG. 10 is a diagram showing state-to-state distances on the state transition graph of FIG. 9.

FIG. 11 is a diagram showing internal state binary logical value vectors assigned to the respective states by the application of the processing by a state assignment unit to the FSM of FIG. 3.

FIG. 12 is a diagram showing two-level logic of a combinational circuit obtained by applying the processing by the state assignment unit to the FSM of FIG. 3.

FIG. 14 is a diagram showing results of the application of the processing by the logic adding unit to the two-level logic of FIG. 12.

FIG. 15 is a diagram showing distances from an asynchronous rest state to other states in the FSM of FIG. 3.

FIG. 19 is a diagram showing state-to-state distances on the state transition graph of FIG. 18.

FIG. 21 is a diagram showing state-to-state distances obtained as a result of the addition of a transition from every state to a state selected as a center state in the FSM of FIG. 18.

FIG. 24 is a diagram showing state transitions in an FSM without an asynchronous reset state.

FIG. 26 is a diagram showing state-to-state distances on the state transition graph of FIG. 25.

FIG. 27 is a diagram showing a result of the application of the processing by a center state selecting unit to the state-to-state distances shown in FIG. 26.

FIG. 29 is a diagram showing state transitions in an FSM after the processing by the transition adding unit is completed.

FIG. 31 is a table showing state-to-state distances on the state transition graph of FIG. 30.

FIG. 32 is a flow chart showing another example of operation of the conventional logic synthesis for testability system.

FIG. 37 is a diagram showing state-to-state distances on the state transition graph of FIG. 36.

FIG. 38 is a diagram showing state-to-state distances obtained in a case where a state C is selected as a center state on the state transition graph of FIG. 36.

FIG. 39 is a diagram showing state-to-state distances obtained in a case where a state E is selected as a center state on the state transition graph of FIG. 36.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
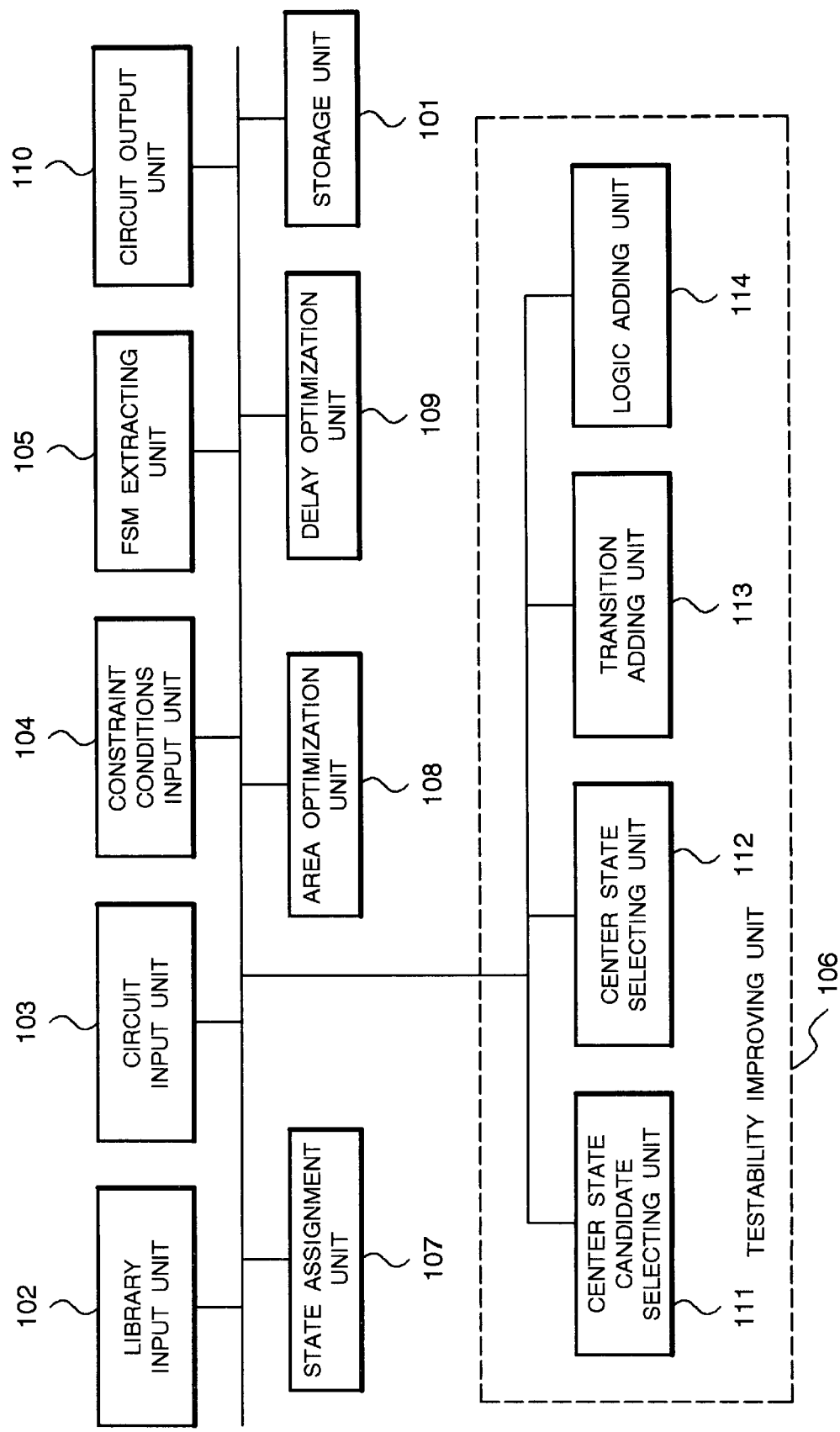
FIG. 1 is a block diagram showing structure of a logic synthesis for testability system according to one embodiment of the present invention.

FIG. 1 is a block diagram showing structure of a logic synthesis for testability system according to one embodiment of the present invention. With reference to FIG. 1, the logic synthesis for testability system of the present embodiment includes a library input unit 102 for reading a technology library for use in technology mapping and holding the same in a storage unit 101, a circuit input unit 103 for reading description of a circuit as a target for logic synthesis and holding the same in the storage unit 101, a constraints input unit 104 for reading constraints such as area and delay and holding the same in the storage unit 101, an FSM extracting unit 105 for extracting an FSM when a circuit held in the storage unit 101 is expressed in other form than FSM, a testability improving unit 106 for improving testability of a circuit represented by an FSM which is held in the storage unit 101, a state assignment unit 107 for assigning a binary logical value vector to a state of a circuit represented by an FSM which is held in the storage unit 101, an area optimization unit 108 for optimizing an area of a circuit held in the storage unit 101, a delay optimization unit 109 for optimizing a delay of a circuit held in the storage unit 101, a circuit output unit 110 for outputting a logic synthesis resultant circuit held in the storage unit 101, and the storage unit 101 for holding a circuit as a target for logic synthesis, a technology library and constraints. The testability improving unit 106 includes a center state candidate selecting unit 111 for excluding a state which will have little effect in improving testability even when selected as a center state from center state candidates, a center state selecting unit. 112 for selecting a center state among selected candidate states, a transition adding unit 113 for adding a transition to the center state to an FSM, and a logic adding unit 114 for adding a logic circuit which generates a binary logical value vector assigned to a center state to a circuit whose state has been assigned.

Figure 2:
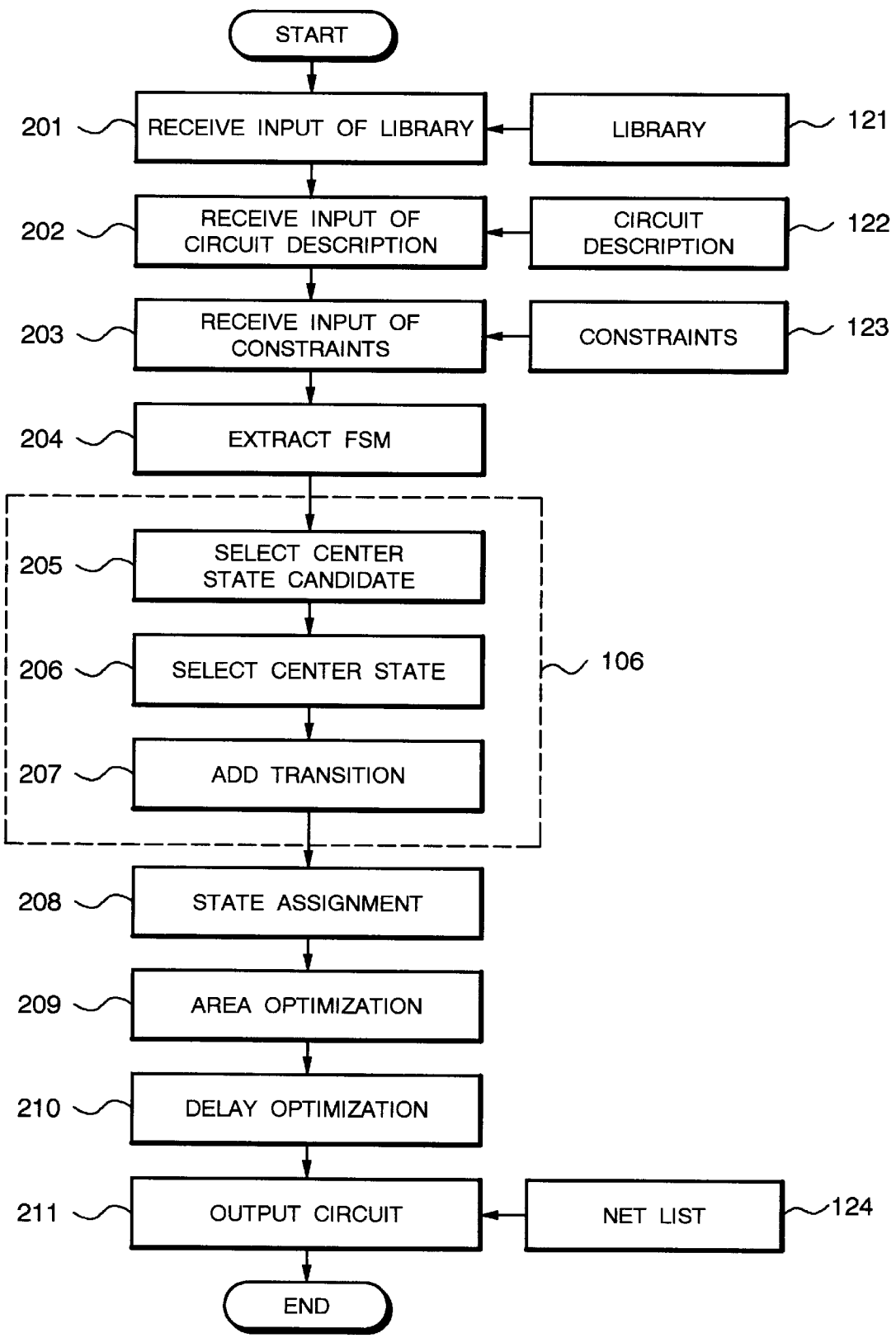
FIG. 2 is a flow chart showing an example of operation of the present embodiment.

Next, description will be made of operation of the present embodiment with reference to the drawings. FIG. 2 is a flow chart showing operation of the present embodiment. With reference to FIG. 2, first, the library input unit 102 reads a technology library 121 and holds the same in the storage unit 101 (Step 201), the circuit input unit 103 reads a circuit description 122 and holds the same in the storage unit 101 (Step 202) and the constraints input unit 104 reads a constraint condition 123 and holds the same in the storage unit 101 (Step 203). Next, the FSM extracting unit 105 extracts an FSM and holds the same in the storage unit 101 when the circuit held in the storage unit 101 is expressed in other form than FSM (Step 204). Then, then center state candidate selecting unit 111 of the testability improving unit 106 excludes a state which will have little effect on testability improvement even when selected as a center state from center state candidates (Step 205). Then, the center state selecting unit 112 selects a center state (Step 206) and the transition adding unit 113 adds a transition from each state to the center state (Step 207). Next, the state assignment unit 107 assigns a binary logical value vector to a state of the FSM held in the storage unit 101 (Step 208). Then, the area optimization unit 108 conducts such area optimization independent of the technology library 121 as two-level logic optimization or logic multi-level and area optimization technology mapping dependent on a technology using the technology library 201 (Step 209). Next, the delay optimization unit 109 conducts delay optimization independent of the technology library 121 and delay optimization technology mapping dependent on a technology using the technology library 121 with respect to the circuit held in the storage unit 301 such that the designated constraint condition 123 is satisfied (Step 210). Lastly, the circuit output unit 110 outputs a net list 124 of a logic synthesis resultant circuit held in the storage unit 101 (Step 211).

As described in the foregoing, in the present embodiment, selection of a center state is not made among all states as candidates but is made excluding an asynchronous reset state itself and a state with a short distance from the asynchronous reset state from center state candidates. As a result, a state with a long distance from the asynchronous reset state and having an effect on distance reduction is selected as the center state. In the application of the present embodiment to an FSM having an asynchronous reset state, therefore, a state having a greater effect of distance reduction will be selected as a center state than that achieved without taking an asynchronous reset state into consideration.

Figure 3:
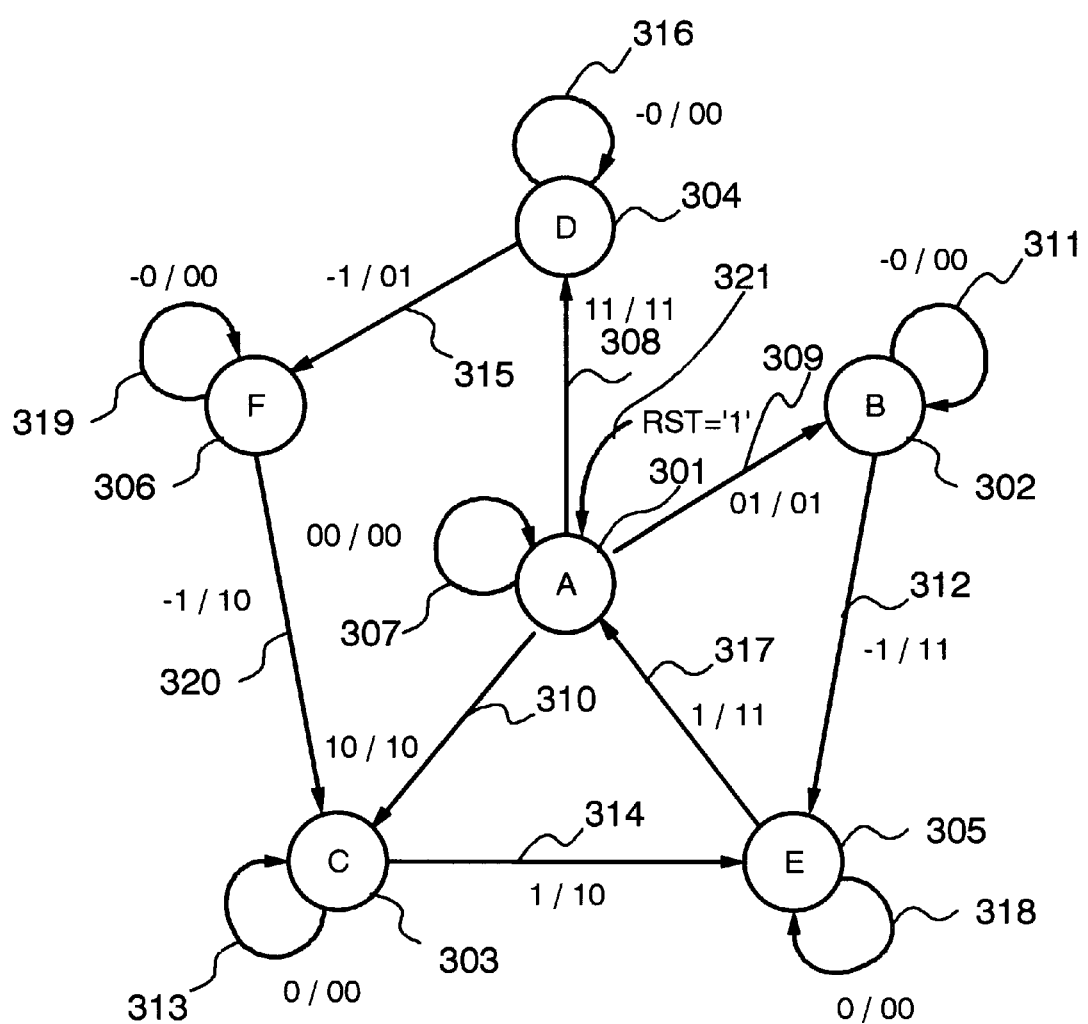
FIG. 3 is a state transition graph of an FSM having an asynchronous reset state as a target for logic synthesis.

Next, operation of the testability improving unit 106 will be described in detail. FIG. 3 is a state transition graph of an FSM having an asynchronous reset state as a target for logic synthesis which is held in the storage unit 101 of FIG. 3 and is composed of two external input terminals, two external output terminals and six states. The asynchronous reset state corresponds to a state A301.

Figure 4:
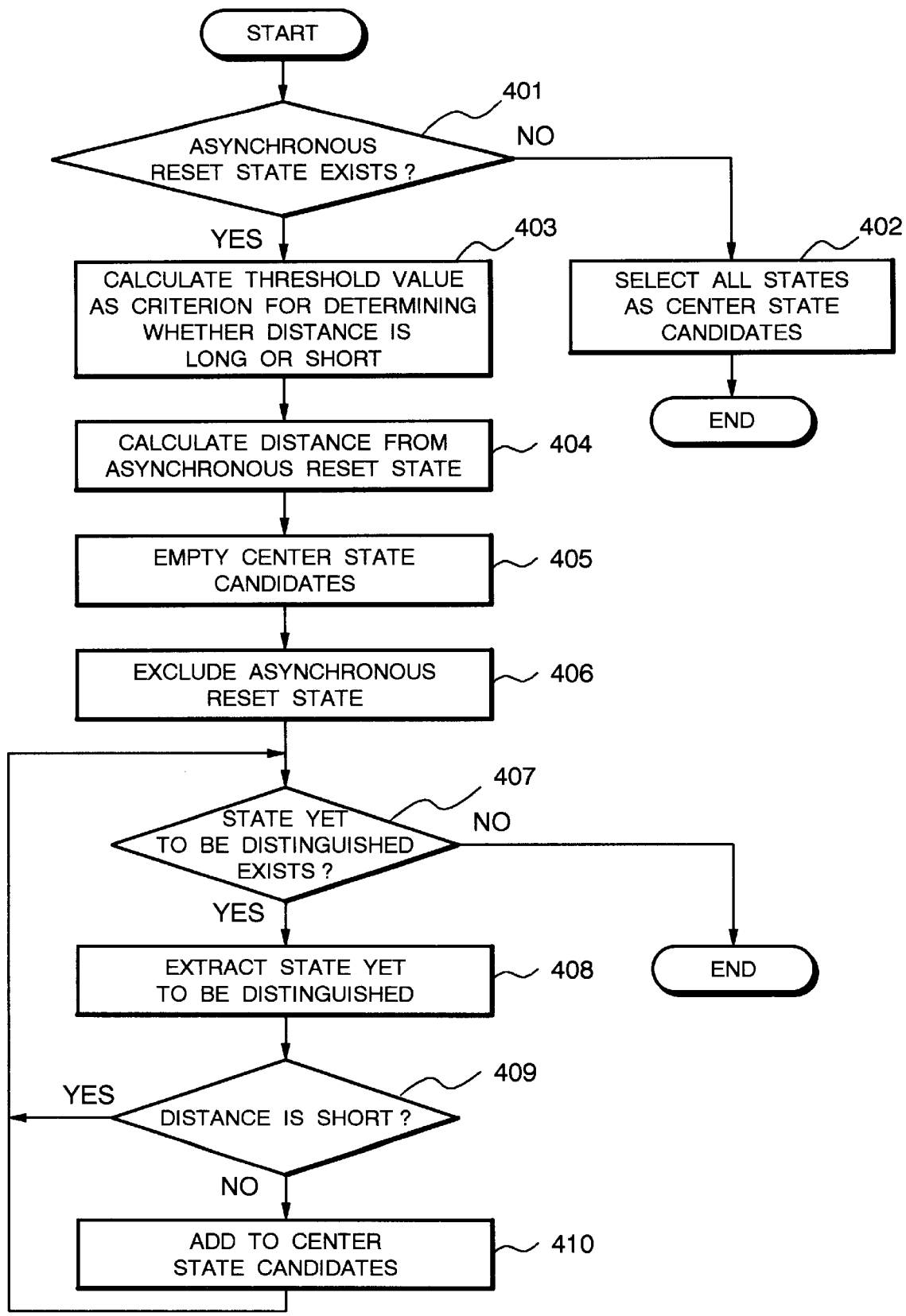
FIG. 4 is a flow chart showing operation of a center state candidate selecting unit in detail.

FIG. 4 is a flow chart showing operation of the center state candidate selecting unit 111 in the testability improving unit 106 in detail. With reference to FIG. 4, the center state candidate selecting unit 111 first determines whether an asynchronous reset state exists or not (Step 401) and when no asynchronous reset state exists, selects all the states as center state candidates to complete its processing (Step 402). On the other hand, when an asynchronous reset state exists, the unit 111 obtains a threshold value as a criterion for the determination whether a distance from the asynchronous reset state is long or short (Step 403). Since in the example shown in FIG. 3, the asynchronous reset state A301 exists, calculation of a threshold value is conducted.

As a technique of determining whether a state-to-state distance is short or long at Step 403, one of possible methods is, for example, excluding, with an average distance value as a threshold value, states with a distance value from an asynchronous reset state smaller than the average value from center state candidates to select states away from the asynchronous reset state as candidates. Another possible method is using such a calculation expression employing the number of states as a calculation result of the square root of the number of states as a threshold value because a possible maximum distance depends on the number of states, and excluding a state with a distance value from an asynchronous reset state smaller than the calculation result from center state candidates to select a state with a long distance from the asynchronous reset state as a candidate. A further possible method is designating the number of states to be selected as candidates and within a limitation of the designated number of candidates to be selected, sequentially selecting candidate states, starting with a state with a long distance from the asynchronous reset state. Still further possible method is designating the number of states to be excluded from candidates and within a limitation of the designated number of candidates to be excluded, sequentially excluding states from candidates, starting with a state with a short distance from the asynchronous reset state. An average distance value between states will be here employed as a criterion for determining whether a distance is long or short. For finding an average state-to-state distance value, distances between all pairs of states are obtained which are shown in FIG. 5. An average distance value is "1.61".

Next, the center state candidate selecting unit 111 obtains a distance from the asynchronous reset state to other state (Step 404 of FIG. 4). Since at the stage of obtaining a threshold value at Step 403, distances from the asynchronous reset state are already obtained and are applied here. More specifically, the A row in FIG. 5 denotes distances from the asynchronous reset state. Then, the unit 111 empties center state candidates (Step 405) to regard the asynchronous reset state as a state whose selection as a candidate has been made and excludes the state from center state candidates (Step 406). As a result, the state A301 will not be selected as a center state. Next, determination is made whether a state exists or not whose selection as a center state candidate is yet to be made (Step 407) to complete the center state candidate selecting unit 111 when all the states are already distinguished. On the other hand, when there remain states yet to be distinguished, the unit 111 extracts one of the states yet to be distinguished and regards the same as having been distinguished (Step 408). It is assumed here that a state B302 is first extracted.

Next, comparison is made between the threshold value obtained at Step 403 and a distance of the state extracted at Step 408 from the asynchronous reset state (Step 409) and when the state-to-state distance is short, the routine returns to Step 407 to extract other state yet to be distinguished. Since the distance of the state B302 from the asynchronous reset state A301 is "1", comparison with the threshold value of "1.61" results in determining that the distance from the asynchronous reset state is short to return to Step 407. On the other hand, when the state-to-state distance is long, the state extracted by the processing of Step 408 is added to center state candidates to return to the processing of Step 407.

Assuming that a state E305 is extracted at Step 408 after the processing for the state B302, comparison at Step 409 between the distance "2" of the state E305 from the asynchronous reset state and the threshold value of "1.61" results in determining that the distance from the asynchronous reset state is long. As a result, the state E305 is added to center state candidates at Step 410 to subsequently return to Step 407.

Thus completed processing by the center state selecting unit 111 with respect to each state results in finding states E305 and F306 as states whose distance values from the asynchronous reset state are larger than the average distance value of "1.61". These two states will be center state candidates.

Figure 6:
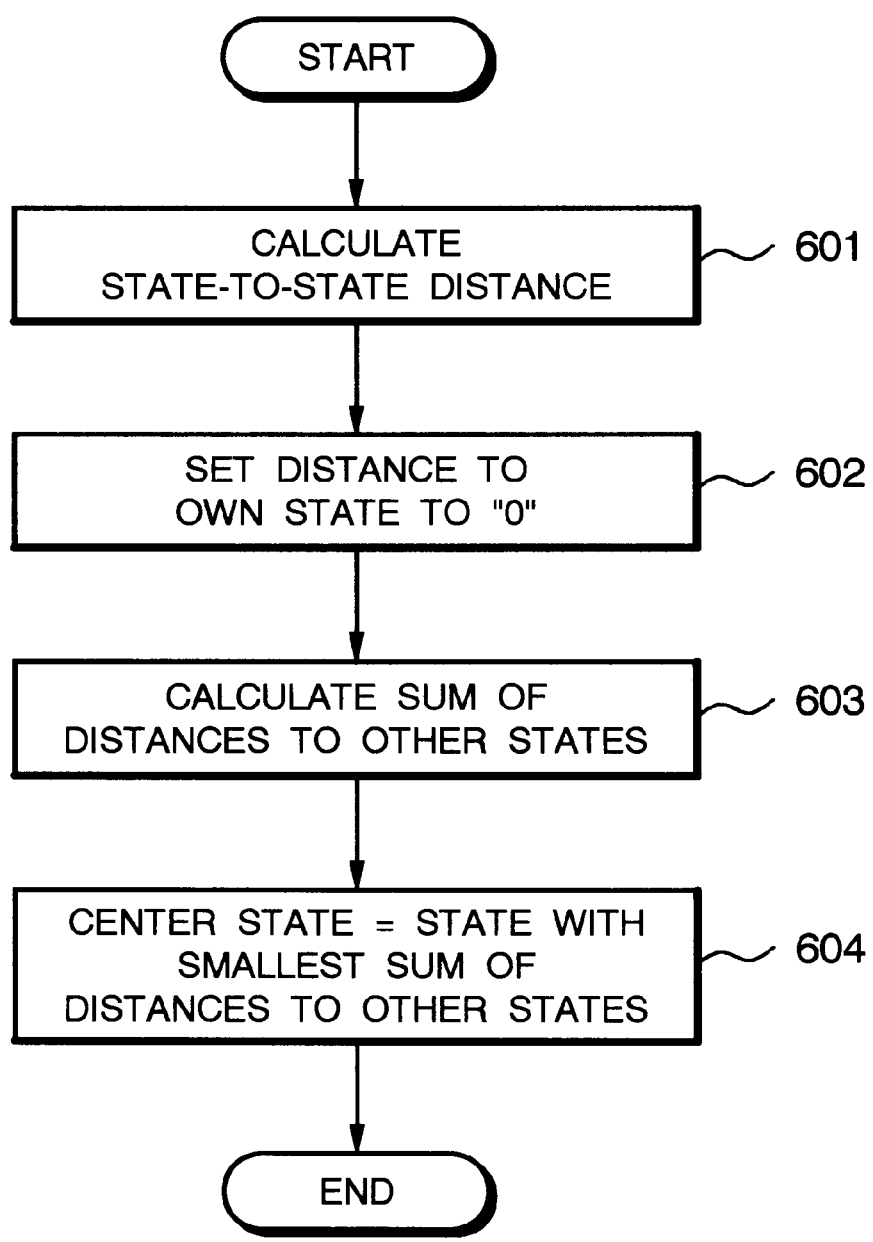
FIG. 6 is a flow chart showing operation of a center state selecting unit in detail.

Description will be next made of operation of the center state selecting unit 112 for selecting a center state among candidates selected by the center state candidate selecting unit 111. FIG. 6 is a flow chart showing operation of the center state selecting unit 112 in detail. With reference to FIG. 6, the center state selecting unit 112 first obtains a distance between center state candidate states (Step 601). For the shortest path at this time, a state which is not among center state candidates may be used as a path. In addition, when a state-to-state distance is already obtained by the center state candidate selecting unit 111, the result may be applied here. In this embodiment, since at the stage of obtaining a threshold value at Step 403, state-to-state distances are already obtained, they will be applied. More specifically, in the example shown in FIG. 5, the matrices in the E row, the E column, in the E row, the F column, in the F row, the E column and in the F row, the F column can be extracted. The extraction result is shown in FIG. 7.

Next, the center state selecting unit 112 sets a distance of each state to its own state to be "0" (Step 602). A result of this processing is shown in FIG. 8. With reference to FIG. 8, unlike FIG. 7, values in the matrices in the E row, the E column and in the F row, the F column are "0". Thereafter, the center state selecting unit 112 obtains a sum of distances between center state candidates and the other states (Step 603). Calculation results are indicated in the column of SUM in FIG. 8. Lastly, the center state selecting unit 112 selects a state whose sum of distances obtained at Step 603 is the smallest as a center state (Step 604). With reference to FIG. 8, since the distances from the state E305 total "3" and distances from the state F306 total "2", the state F306 with the smallest sum of distances is selected as a center state.

Figure 9:
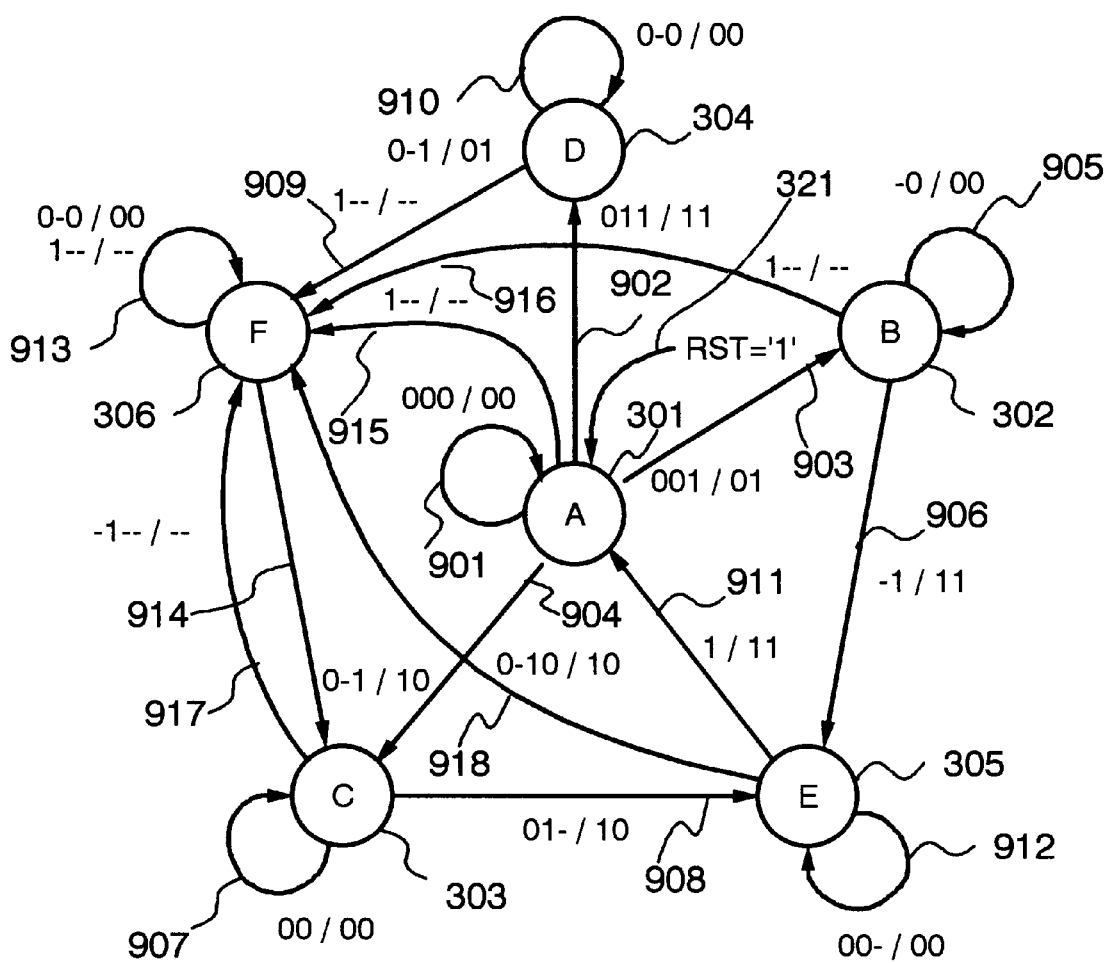
FIG. 9 is a diagram showing a state transition graph indicative of a state in which the processing by a testability improving unit is applied to the FSM of FIG. 3.

Description will be next made of operation of the transition adding unit 113 for adding a transition from every state to the state F306 selected as the center state by the center state selecting unit 112 to add testability achieved by distance reduction. FIG. 9 is a state transition graph of an FSM obtained as a result of the addition of transitions. In FIG. 9, signs 901 to 908 respectively indicate transitions 307 to 314 with a logical value of the center state controlling external input terminal added to transition conditions, a sign 909 indicates a transition 315 with a condition for a transition to the center state and a logical value of the center state controlling external input terminal added to the transition conditions, signs 910 to 912 respectively indicate transitions 316 to 318 with a logical value of the center state controlling external input terminal added to the transition conditions, a sign 913 indicates a transition 319 with a condition for a transition to the center state and a logical value of the center state controlling external input terminal added to the transition conditions, a sign 914 indicates a transition 320 with a logical value of the center state controlling external input terminal added to the transition conditions and signs 915 to 918 indicate a transition to the center state.

Results of distances obtained between all pairs of states in the FSM shown in FIG. 10 are illustrated in FIG. 10. With reference to FIG. 10, an average state-to-state distance value is "1.41", which shows a drastic reduction as compared with the average state-to-state distance value of "1.61" shown in FIG. 31 which is obtained as a result of the reduction by the conventional art.

Description will be next made of a case where as a criterion for determining whether a distance between a predetermined state and an asynchronous reset state is long or short, a numeric value of a calculation result of a calculation expression employing the number of states as a threshold value is used in the center state candidate selecting unit 111 of the testability improving unit 106 and testability is added by the logic adding unit 114.

It is assumed here that the center state candidate selecting unit 111 uses, as a threshold value, a numeric value obtained by dividing the square root of the number of states by 2 as a calculation expression. It is also assumed that at a stage where a combinational circuit part of a sequential circuit generated by the state assignment unit 107 is expressed by two-level logic, the logic adding unit 114 adds logic for generating an internal state binary logical value vector assigned to a center state, that is, a cube, to the two-level logic.

According to this technique, since a calculation result of a calculation expression using the number of states as a threshold value is used for determining whether a distance from an asynchronous reset state is long or short, it is unnecessary for obtaining a distance between every pair of states. In addition, since a cube of logic equivalent to a transition to a center state is added to two-level logic expressing a combinational circuit to which the state assignment unit 107 has been applied, equal testability can be obtained to that attained in a case where a transition is added by the transition adding processing or where a logic element is added by the logic adding processing.

Figure 16:
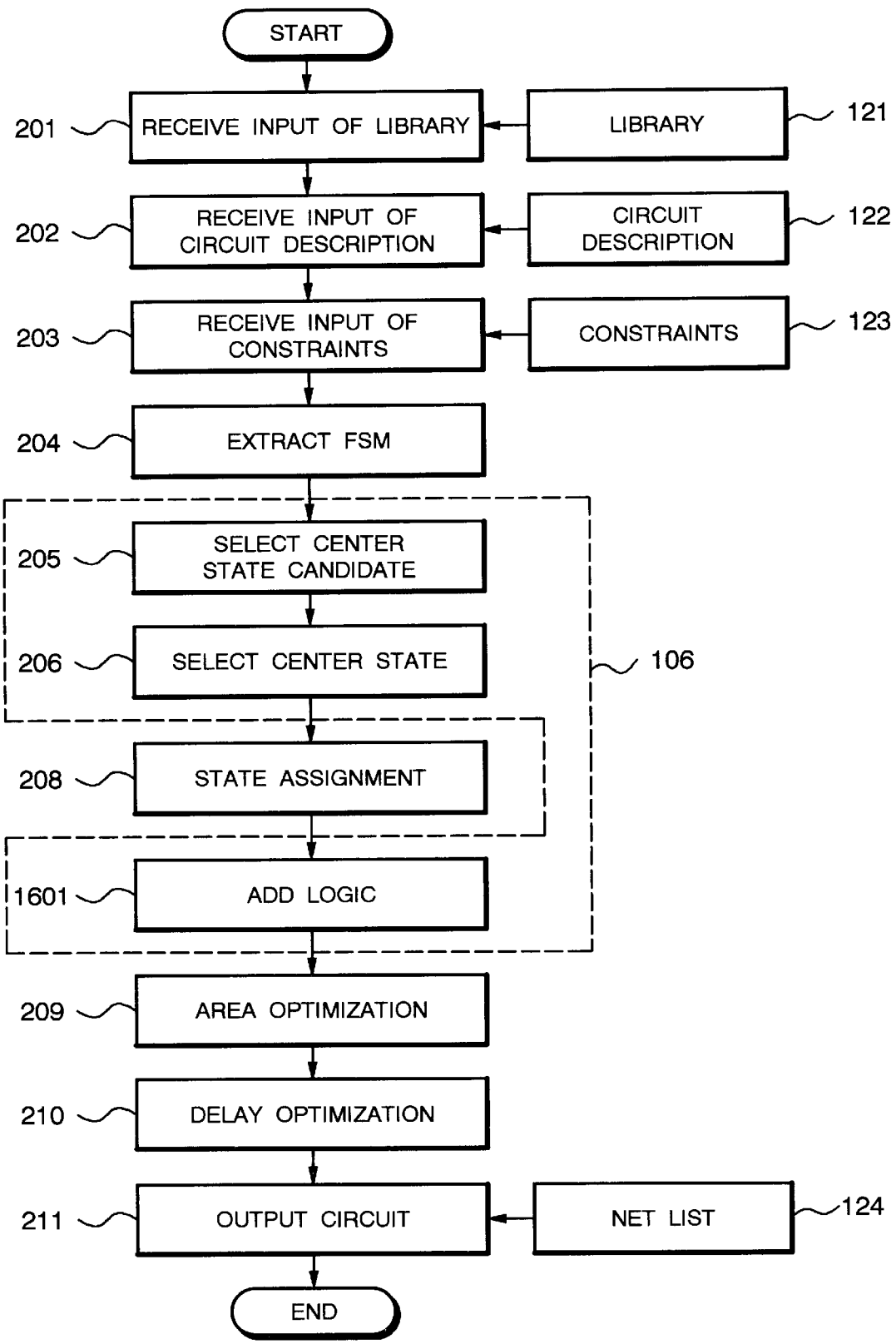
FIG. 16 is a flow chart showing another example of operation of the present embodiment.

Description will be next made of operation to be conducted when the above-described technique is employed. FIG. 16 is a flow chart showing operation of the present embodiment employing this technique. With reference to FIG. 16, unlike the operation shown in FIG. 2, immediately after the execution of the processing by the center state selecting unit 112 at Step 206, the processing by the state assignment unit 107 is conducted at Step 208 and then the logic adding processing (Step 1601) is conducted by the logic adding unit 114. That is, the processing by the transition adding unit 113 is not executed.

Next, operation of the testability improving unit 106 will be described in detail, with the FSM shown in FIG. 3 as a target for logic synthesis. At Step 205 of FIG. 16, center state candidates are selected by the center state candidate selecting unit 111. With reference to the flow chart of FIG. 4, operation of the center state candidate selecting unit 111 will be detailed. When there exists no asynchronous reset state at Step 401, all the states are selected as candidates to complete the center state candidate selecting unit 111 (Step 402). On the other hand, when there exists an asynchronous reset state, a threshold value as a criterion for determining whether a distance from the asynchronous reset state is long or short is obtained (Step 403). In the example shown in FIG. 3, the asynchronous reset state A301 exists, so that calculation of a threshold value is executed. Since a threshold value is a numeric value obtained by dividing the square root of the number of states by 2 and the number of states is "6", the threshold value is obtained as "1.22".

Next, the center state candidate selecting unit 111 obtains a distance from the asynchronous reset state to other state (Step 404). Then, the unit 111 empties center state candidates (Step 405), regards the asynchronous reset state as having been distinguished and excludes the same from center state candidates (Step 406). As a result, the state A301 will not be selected as a center state. Next, determination is made whether there exists a state whose selection as a center state is yet to be made (Step 407) to complete the center state candidate selecting unit 111 when selection of all the states has been made. On the other hand, when there remain states whose selection is yet to be made, the unit 111 extracts one of the states whose selection is yet to be made and regards the extracted state as having been distinguished (Step 408). It is assumed here that the state B302 is extracted first.

Next, the unit 111 compares the threshold obtained at Step 403 and a distance of the state extracted at Step 408 from the asynchronous reset state (Step 409) and when the state-to-state distance is short, the routine returns to Step 407 to extract another state whose selection is yet to be made. Since the distance of the state B302 from the asynchronous reset state A301 is "1", the comparison with the threshold value of "1.22" results in determining that the distance from the asynchronous reset state is short to return to Step 407. On the other hand, when the state-to-state distance is long, the state extracted by the processing of Step 407 is added to the center state candidates to return to the processing of Step 407.

Assuming that subsequently to the processing with respect to the state B302, the state E305 is extracted at Step 408, comparison at Step 409 between the distance "2" of the state E305 from the asynchronous reset state and the threshold value "1.22" results in determining that the distance from the asynchronous reset state is long. The state E305 is accordingly added to the center state candidates at Step 410 to return to Step 407.

Thus completed processing by the center state candidate selecting unit 111 with respect to each state results in finding the states E305 and F306 as states whose distance values from the asynchronous reset state are larger than the average distance value of "1.22" and are accordingly selected as center state candidates.

Description will be next made of operation of the center state selecting unit 112 for selecting a center state among candidates selected by the center state candidate selecting unit 111 with reference to FIG. 6. The center state selecting unit 112 first obtains a distance between center state candidate states (Step 601). For the shortest path at this time, other states than the center state candidate states may be used as a path. The extraction result obtained by this processing is the same as that shown in FIG. 7.

Next, the center state selecting unit 112 sets a distance of each state to its own state to be "0" (Step 602). Result of this processing is the same as that shown in FIG. 8. Thereafter, the center state selecting unit 112 obtains a sum of distances between the center state candidates and the other states (Step 603). The calculation result is the same as that indicated in the column of SUM in FIG. 8. Lastly, the center state selecting unit 112 selects the state whose sum of distances obtained at Step 603 is the smallest as a center state (Step 604). Here, the stale F306 with the smallest sum of distances is selected as the center state according to FIG. 8.

Next, at Step 208 of FIG. 16, the state assignment unit 107 assigns an internal state binary logical value vector to each state of the FSM. As described in the section of the above Related Art, the state assignment unit 107 expresses the FSM by an FF for representing a state as an assigned internal state binary logical value vector and a combinational circuit for generating an external output terminal logical value and a data input logical value of the FF from an external input terminal logical value and an output logical value of the FF. One way of expressing this combinational circuit is multi-input mult-output two-state logic. Here, to the two-level logic, a cube for generating an internal state binary logical value vector assigned to the center state is added.

FIG. 11 is a diagram showing an internal state binary logical value vector assigned to each state which is obtained by the application of the state assignment unit 107 to the FSM of FIG. 3. In FIG. 11, signs 1101 to 1106 denote internal state binary logical value vectors assigned to the respective states of the FSM of FIG. 3, signs 1107 to 1108 denote unused binary logical value vectors which have not been assigned to the states of the FSM of FIG. 3, and signs 1109 to 1111 denote FFs for holding the internal state binary logical value vectors. More specifically, FIG. 11 shows that the FFs 1109 to 1111 are generated and to the state A301, for example, an internal state "000" (internal state binary logical value vector 1101) is assigned. "101" (binary logical value vector 1107) and "111" (binary logical value vector 1108) are binary logical value vectors which have not been used for assignment.

FIG. 12 is a diagram showing two-level logic representing a combinational circuit part obtained by the application of the processing by the state assignment unit 107 to the FSM of FIG. 3. In FIG. 12, signs 1201 to 1214 denote cubes each indicative of a transition, while signs 1215 and 1216 denote cubes for employing unused binary logical value vectors as "don't care". The left side part partitioned by the symbol ":" denotes an input logical value and the right side denotes an output logical value. An input logical value is composed of an external input terminal logical value and an output logical value of an FF, while an output logical value is composed of a data input logical value to the FF and an external output terminal logical value. Both FF output logical values and FF data input logical values are described by the values of the FF1109, FF1110 and FF1111 in this order. It is shown, for example, that the cube 1202, at the application of a clock when the external input terminal logical value is "01" and the internal state of the FF is "000", sets the internal state of the FF to "010" and the external output terminal logical value to "01". This is equivalent to a transition 309. The cube 1215 is a cube employing unused binary logical value vector "101" (1107) as "don't care". These relationships are also established for other cubes.

Figure 13:
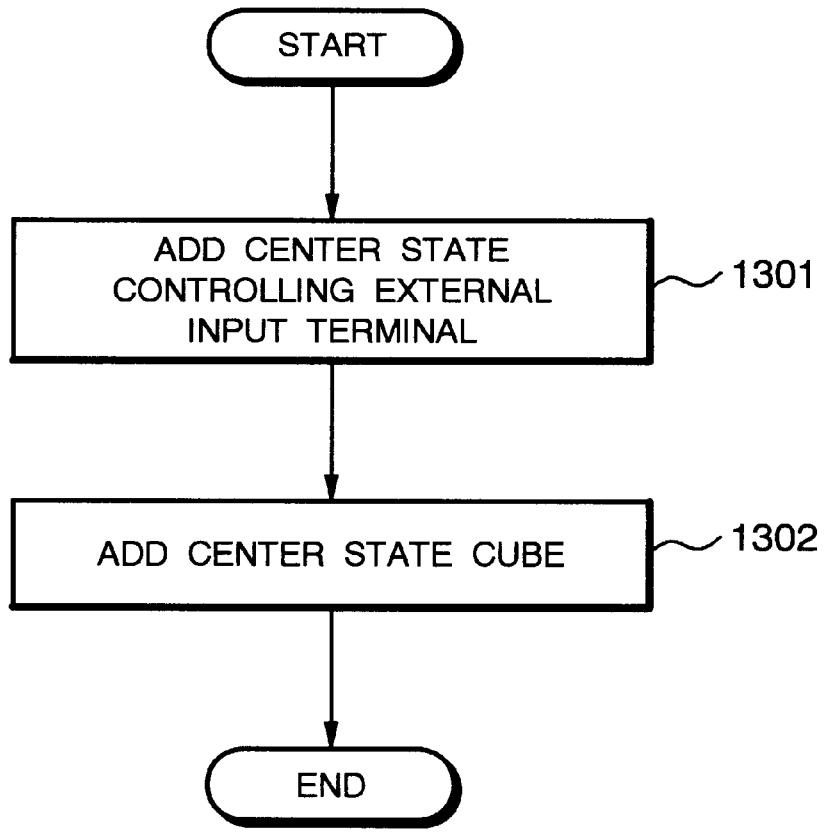
FIG. 13 is a flow chart showing operation of a logic adding unit.

FIG. 13 is a flow chart showing operation of the logic adding unit 114 to add a cube for generating an internal state binary logical value vector assigned to a center state. FIG. 14 is a diagram showing results of the application of the processing of the logic adding unit 114 for adding a cube to the two-level logic illustrated in FIG. 12. In FIG. 14, signs

1401 to 1416 denote cubes 1201 to 1216 with center state controlling external input terminal logical values added, respectively, and a sign 2817 denotes a center state binary logical value vector generating cube.

With reference to FIG. 13, the logic adding unit 114 first adds a logical value of the center state controlling external input terminal to each cube (Step 1301). More specifically, it is assumed that when the logical value of the center state controlling external input terminal is "0", the unit 114 conducts the original operation and when the logical value is "1", the unit generates an internal state binary logical value vector assigned to the center state. The cube 1201, for example, is changed into the cube 1401 by adding a condition that the logical value of the center state controlling external input terminal is "0". The same processing will be conducted with respect to the other cubes.

Next, the logic adding unit 114 adds a cube for generating a binary logical value vector assigned to the center state (Step 1302). The cube 1417 in FIG. 14 is the added cube. When the logical value of the center state controlling external input terminal is "1", the cube 1417 sets the FF data input logical value to "110" regardless of other external input terminal logical value and an output logical value of the FF. In other words, the cube generates the binary logical value vector 1106 assigned to the state F306 which is selected as the center state, thereby regarding a logical value of the external output terminal as "don't care".

The generated circuit therefore conducts the same operation as that of the original circuit according to the cubes 1401 to 1416 when the logical value of the center state controlling external input terminal is "0" and sets the values of the FFs 1109 to 1111 to the internal state binary logical value vector of "110" assigned to the state F306 which is selected as the center state when the logical value of the center state controlling external input terminal is "1". As a result, the same effect as that produced by the logic adding unit 114 for adding a logic element can be attained.

Description will be next given of a case where the center state candidate selecting unit 111 of the testability improving unit 106 excludes a state whose distance from other state is short from center state candidates.

One of possible methods for determining whether a distance between a predetermined state and other state is long or short is, for example, determining that a distance from a predetermined state to other states is short when at the predetermined state, a sum of distances from other states is smaller than a numeric value obtained by multiplying an average value of distances between the predetermined state and all other states by the number of all other states, that is, the total number of states minus one. Another possible method is designating the number of states to be excluded from center state candidates and within a limitation of the designated number of candidates to be excluded, sequentially excluding the states from candidates, starting with a state whose distance from other states is short. A further possible method is determining that a distance of a predetermined state to other states is short when the predetermined state fails to have a distance value from other state that is larger than a designated threshold value or a threshold value obtained by a predetermined calculation expression. Employed here is the method of determining that a distance from other states is short when a sum of distances from other states is smaller than a numeric value obtained by multiplying an average distance value by the number of all other states.

The above method enables only a state that will produce a great effect in improving testability to be selected as a center state by excluding a state whose distance from other states is short from center state candidates. Use of the method also enables a state which will produce a great effect in improving testability to be selected as a center state also for an FSM having no asynchronous reset state.

Figure 17:
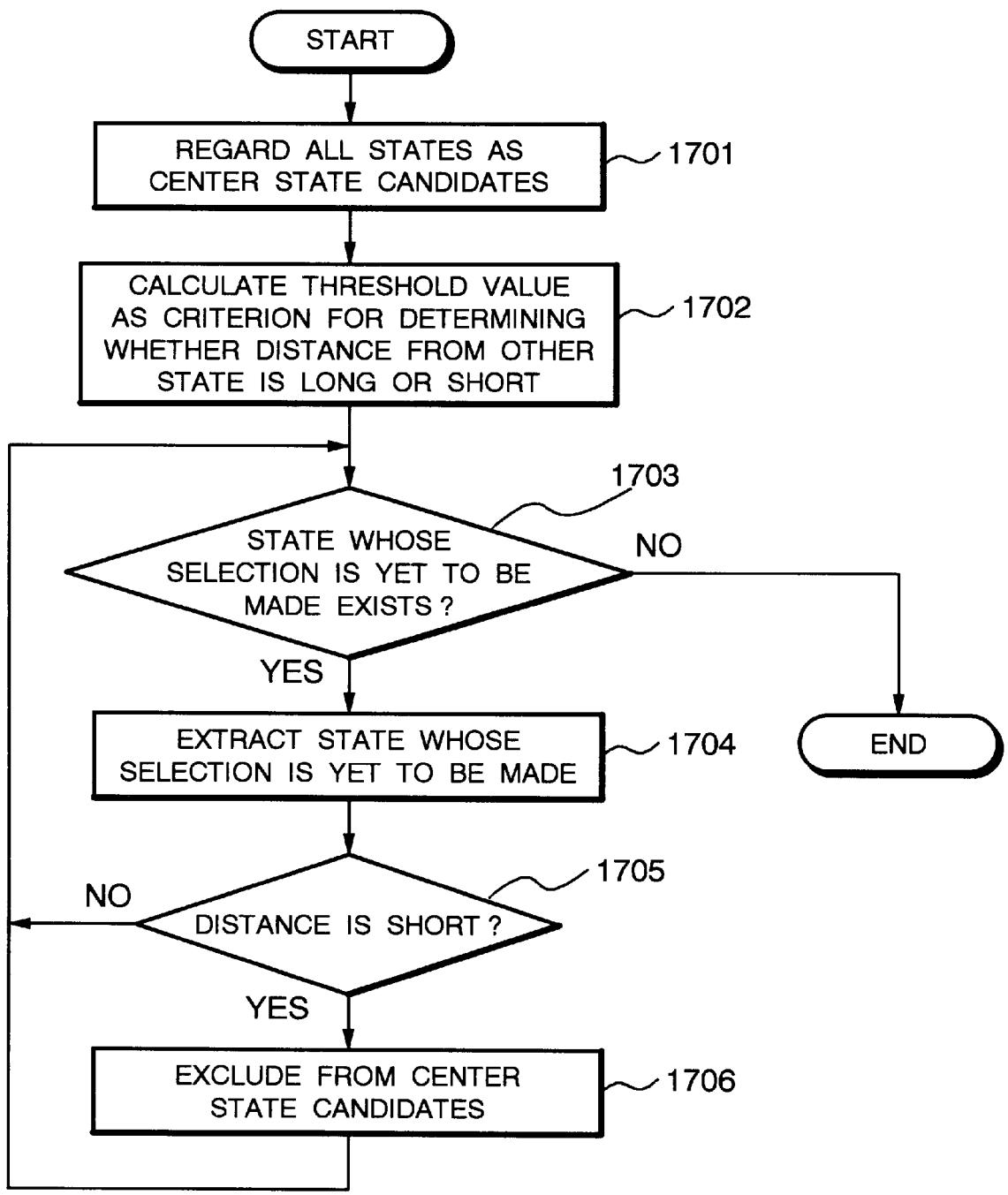
FIG. 17 is a flow chart showing another operation of the center state candidate selecting unit.
Figure 36:
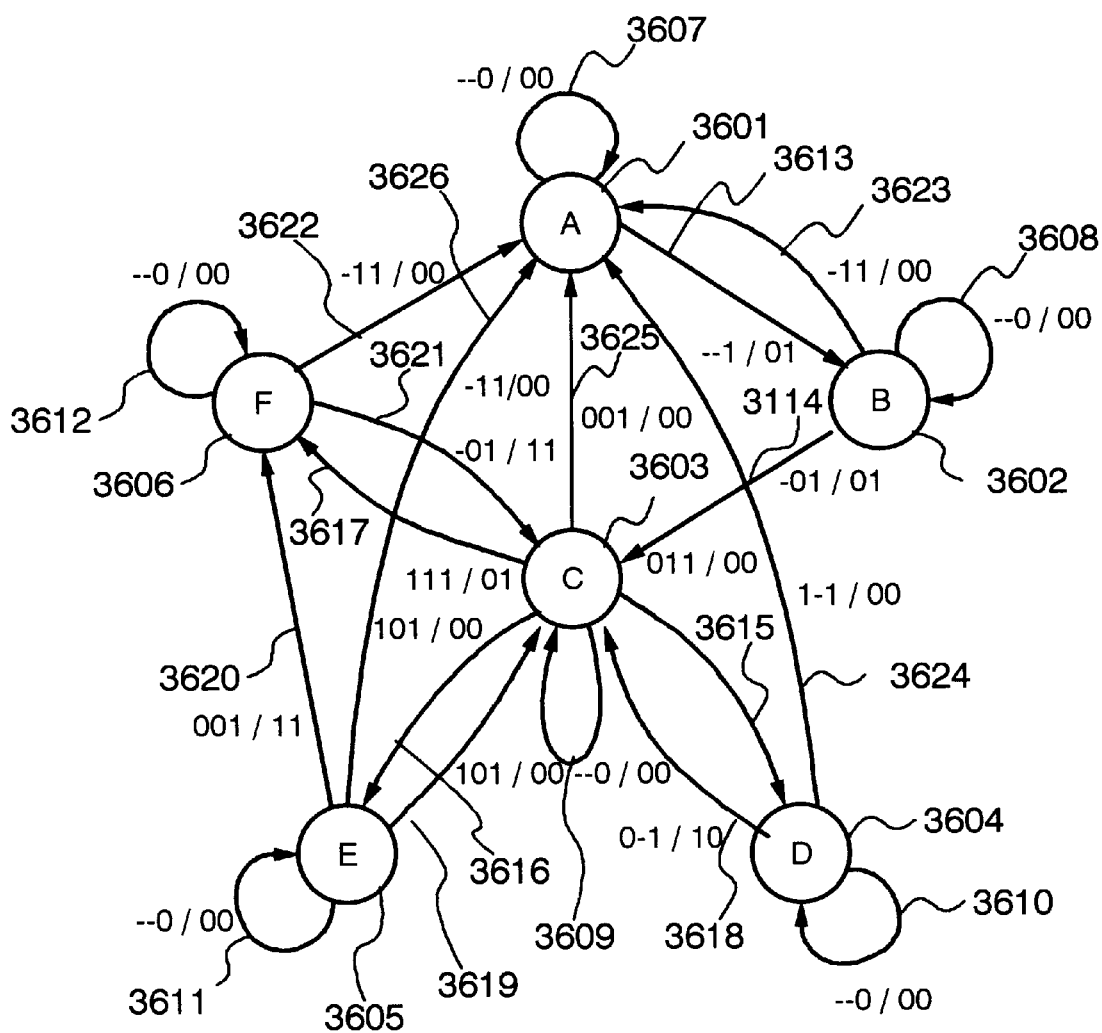
FIG. 36 is a diagram showing a further example of a state transition graph of an FSM having an asynchronous,reset state as a target for logic synthesis.

Description will be next made of operation conducted when the above method is employed. FIG. 17 is a flow chart showing in detail operation of the center state candidate selecting unit 111 in the present embodiment when the above method is employed. It is assumed that a state transition graph of an FSM as a target for logic synthesis which is held in the storage unit 101 is the state transition graph illustrated in FIG. 36. FIG. 37 is a diagram showing results of distances obtained between pairs of states in the FSM illustrated in FIG. 36. With reference to FIG. 37, an average distance value is "1.52". In FIG. 36, signs 3601 to 3606 denote states of the FSM, while signs 3607 to 3626 denote state-to-state transitions in the FSM.

With reference to FIG. 17, the center state candidate selecting unit 111 first regards all the states in the FSM as center state candidates (Step 1701). Then, the unit 111 obtains a threshold value as a criterion for determining whether a distance from other state is long or short (Step 1702). Since in the example shown in FIG. 36, an average distance is "1.52" and the number of states is "6", a threshold value is obtained as "7.6".

Next, the center state candidate selecting unit 111 determines whether there exists a state whose selection as a center state candidate is yet to be made (Step 1703) and when the selection of all the states has been made, the center state candidate selecting unit 111 is completed. On the other hand, when there remain states whose selection is yet to be made, the unit 111 extracts one of the states yet to be selected and regards the extracted state as a state whose selection has been made (Step 1704). It is assumed here that the state A3601 is first extracted.

Next, the unit 111 compares the threshold value obtained at Step 1702 and a sum of distances from the state extracted at Step 1704 to other states and when the distance is short, excludes the state from center state candidates to return to Step 1703 to extract another state whose selection is yet to be made (Steps 1705 and 1706). On the other hand, when the state-to-state distance is long, the routine returns directly to Step 1703 without exclusion of the state from center state candidates. Since a sum of distances of the state A3603 from all other states is "5", comparison with the threshold value of "7.6" results in determining that the distance from other states is short, so that the unit 111 excludes the state A3601 from center state candidates.

Assuming that subsequently to the processing with respect to the states A3601, the state B3602 is extracted at Step 1703, comparison between a sum of "9" of distances from the state B3602 to all other states and the threshold value "7.6" results in determining that the distance from other states is long at Step 1705. The state B3602 will not therefore be excluded from center state candidates.

The processing with respect to each state thus completed by the center state candidate selecting unit 111 results in finding states B3602, D3604, E3605 and F3606 as states whose sum of distances from other states is larger than the threshold value of "7.6", and the four states will be regarded as center state candidates.

Next, the center state selecting unit 112 selects a center state from the candidates selected by the center state candidate selecting unit 111. Since details of the operation of the center state selecting unit 112 are the same those of the operation example described above with reference to FIG. 6, no description will be made thereof. As a result of the processing by the center state selecting unit 112, the state E3605 is selected as a center state.

FIG. 39 is a diagram showing results of distances between pairs of states in the FSM illustrated in FIG. 36 obtained as a result of the addition of a transition from every state to the state E3605 selected as the center state. With reference to FIG. 39, an average value of state-to-state distances is "1.36", which shows a drastic reduction as compared with an average state-to-state distance of "1.41" attained as a result of the reduction by conventional art.

Description will be next given of a case where the center state candidate selecting unit 111 of the testability improving unit 106 excludes, from center state candidates, an asynchronous reset state, a state with a short distance from the asynchronous reset state and a state with a short distance from other states.

Employed here for determining whether a distance from an asynchronous reset state is long or short is a method of sequentially excluding states from center state candidates within a limitation of the number of states designated as the number of center state candidates, starting with a state with a short distance from the asynchronous reset state. Among manners of designating the number of states to be excluded are direct designation of the number of states to be excluded and designation of a ratio to the total number of states. Here, it is assumed that one state close to the asynchronous reset state is designated to be excluded from candidates.

As a method of determining whether a distance between a predetermined state and other states is long or short, the same technique for determining whether a distance from an asynchronous reset state is long or short may be employed or other technique may be employed. Adopted here for determining whether a distance from other states is long or short is a method of designating a number of states to be excluded and within a limitation of the designated number of states, sequentially excluding states from center state candidates, starting with a state whose sum of distances from other states is small. More specifically, it is assumed here that one state close to other state is designated to be excluded from candidates.

The processing using the foregoing methods enables an asynchronous reset state, a state with a short distance from the asynchronous reset state and a state with a short distance from other states to be excluded from center state candidates. In addition, since the number of states to be excluded from center state candidates is designated, it is unnecessary to calculate a threshold value as a criterion for distance determination.

Figure 18:
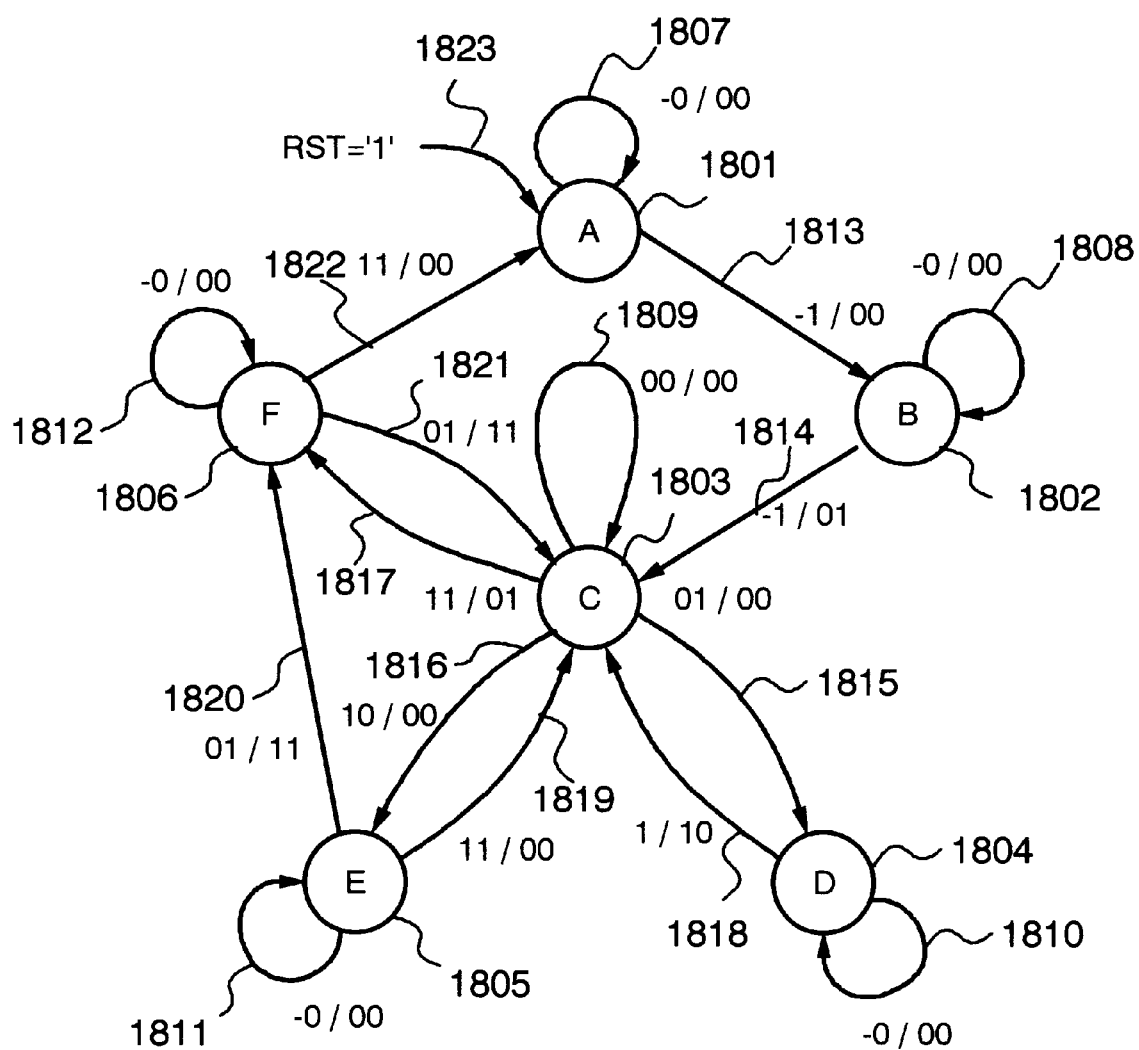
FIG. 18 is a diagram showing another example of a state transition graph of an FSM having an asynchronous reset state as a target for logic synthesis.

Description will be next given of operation in a case where the above methods are employed. FIG. 18 is a state transition graph of an FSM as a target for logic synthesis held in the storage unit 101. FIG. 19 is a diagram showing results of distances obtained between pairs of states in the FSM of FIG. 18. In FIG. 18, signs 1801 to 1806 denote state of the FSM, signs 1807 to 1822 denote transitions between states of the FSM and a sign 1823 denotes an asynchronous reset transition. An average distance value is "1.52". When the conventional technique is applied to the FSM of FIG. 18, the state C1803 is selected as a center state and as a result of the addition of a transition to the center state, the average distance is reduced to "1.41".

Figure 20:
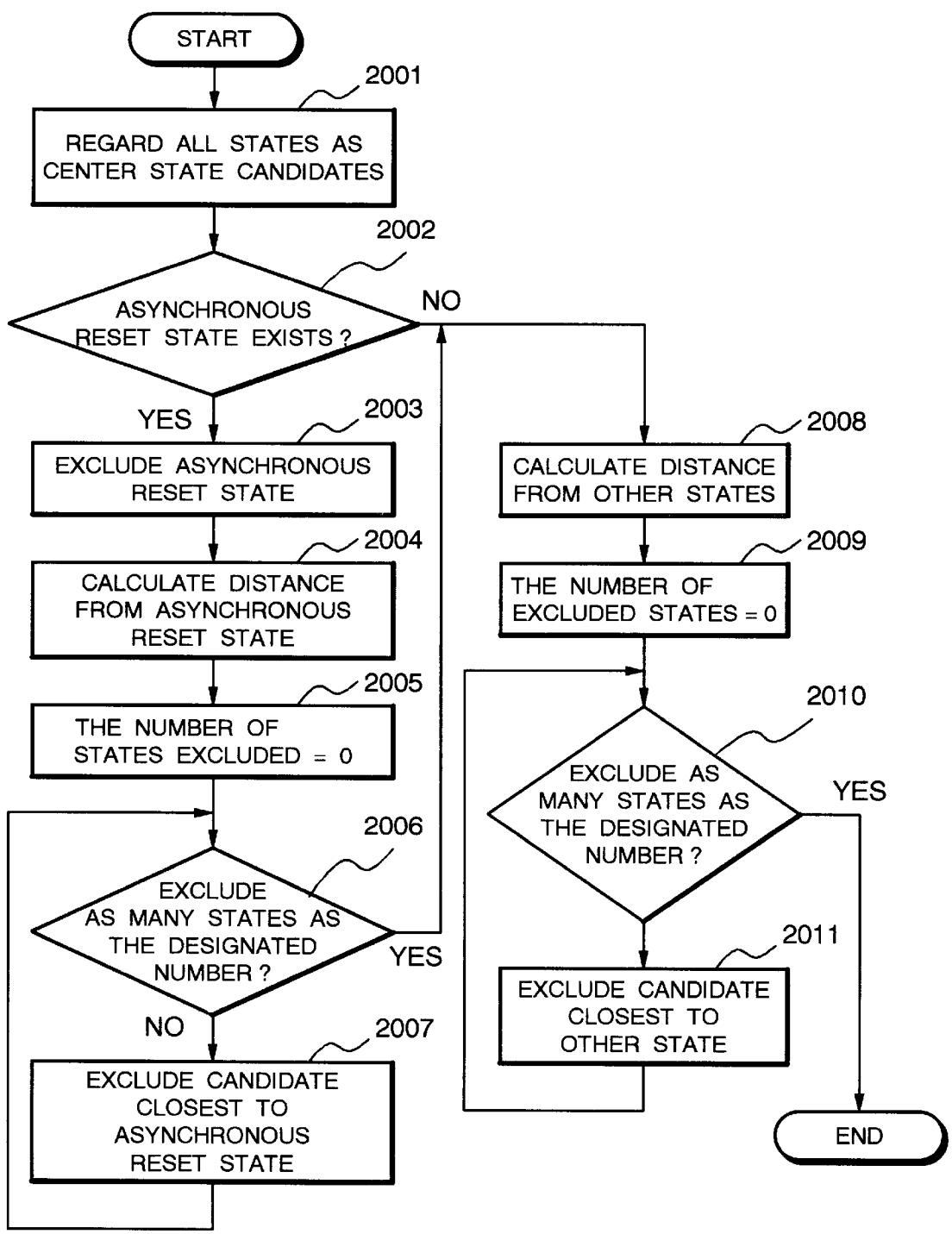
FIG. 20 is a flow chart showing further operation of the center state candidate selecting unit.
Figure 22:
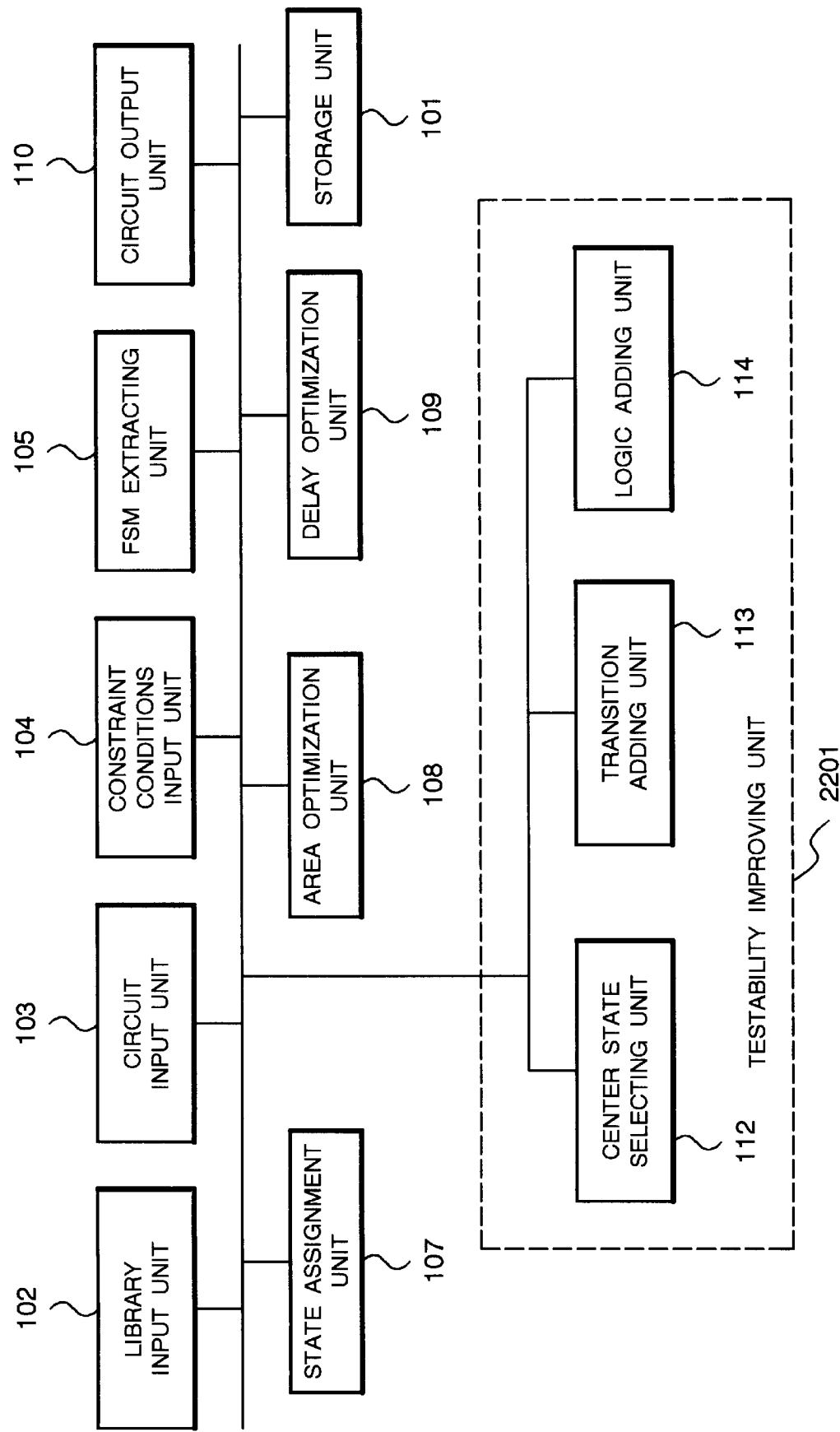
FIG. 22 is a block diagram showing structure of a conventional logic synthesis for testability system.
Figure 23:
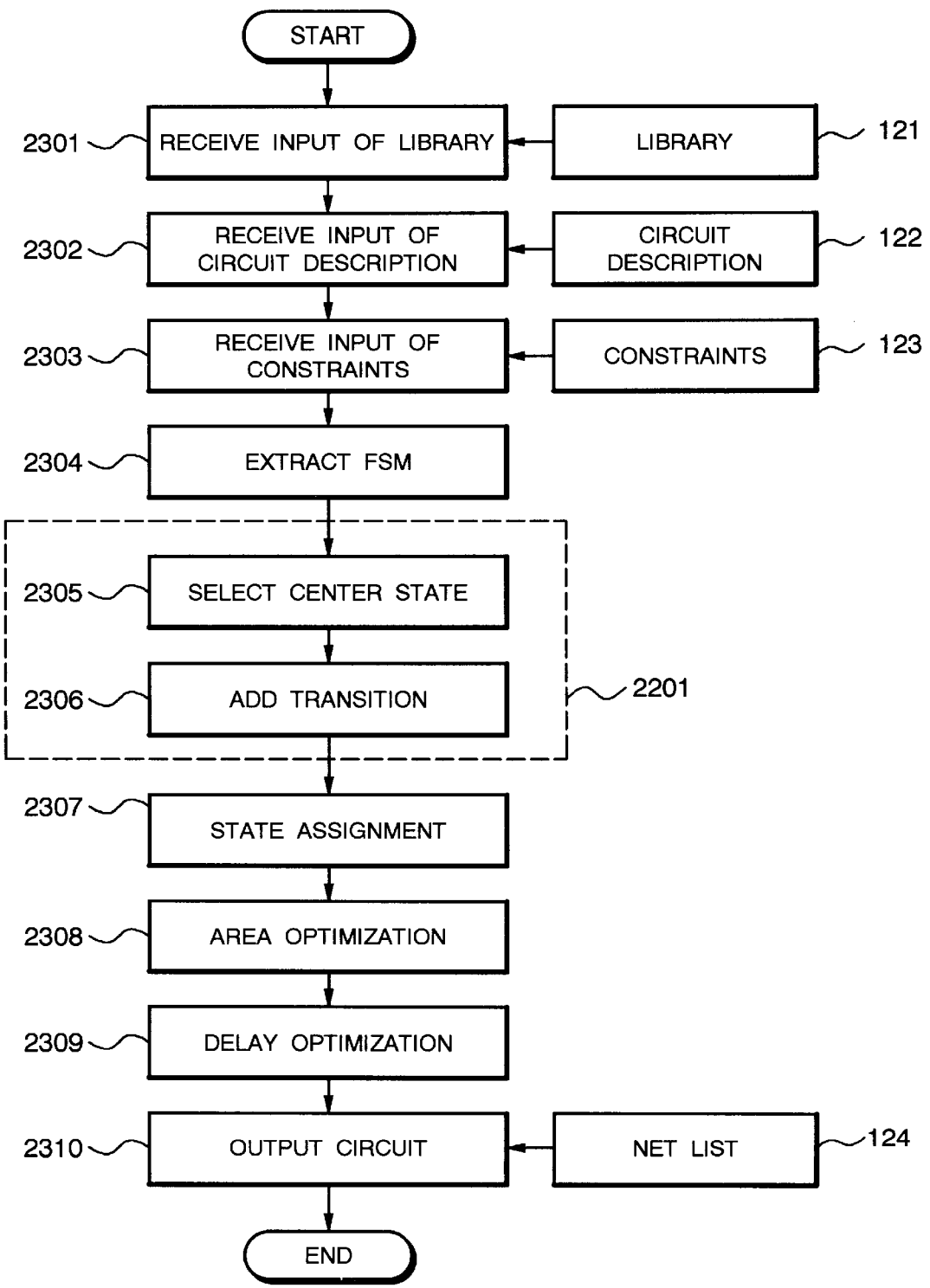
FIG. 23 is a flow chart showing an example of operation of the conventional logic synthesis for testability system.
Figure 25:
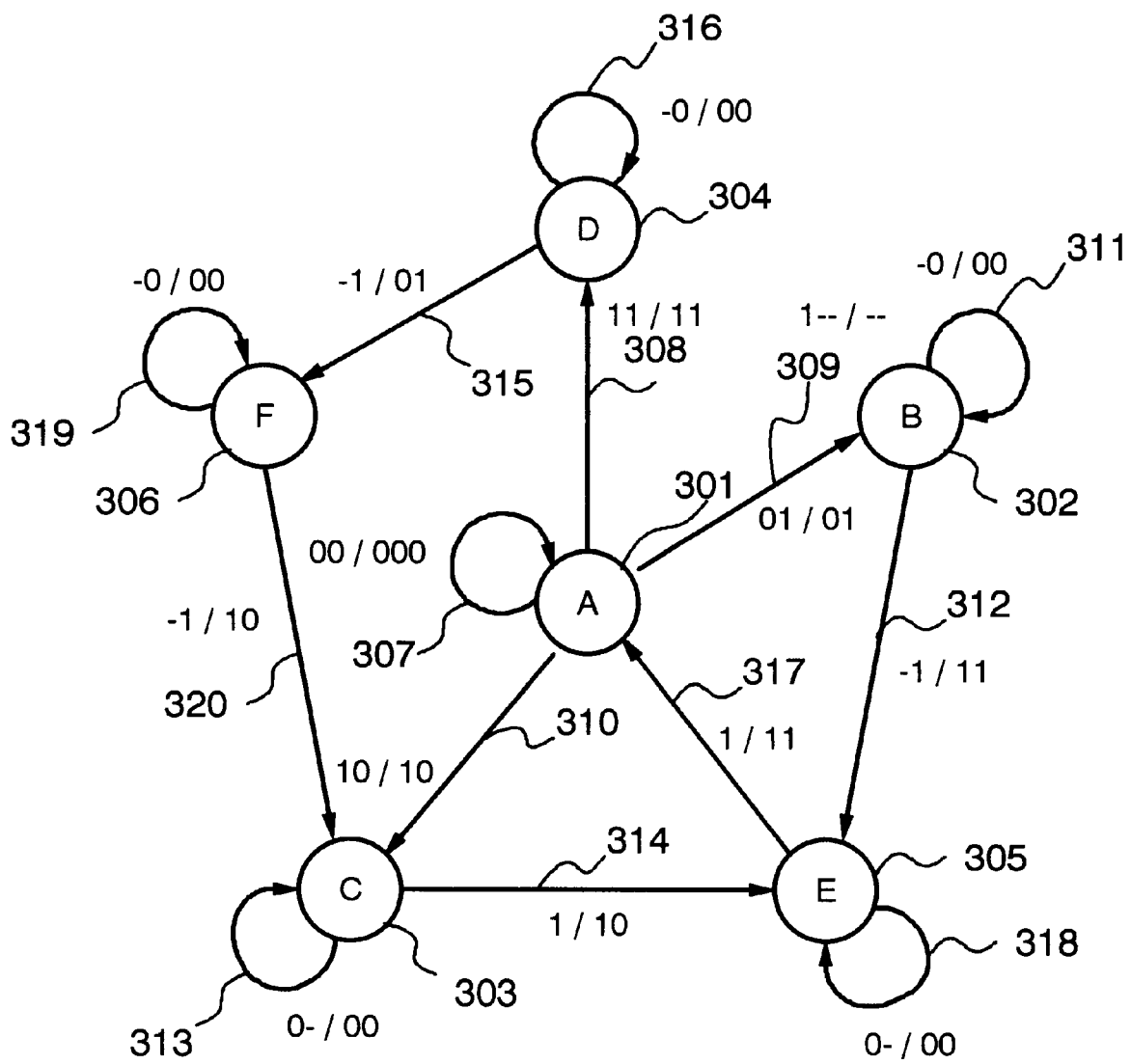
FIG. 25 is a diagram showing a state transition graph of the FSM illustrated in FIG. 24.
Figure 28:
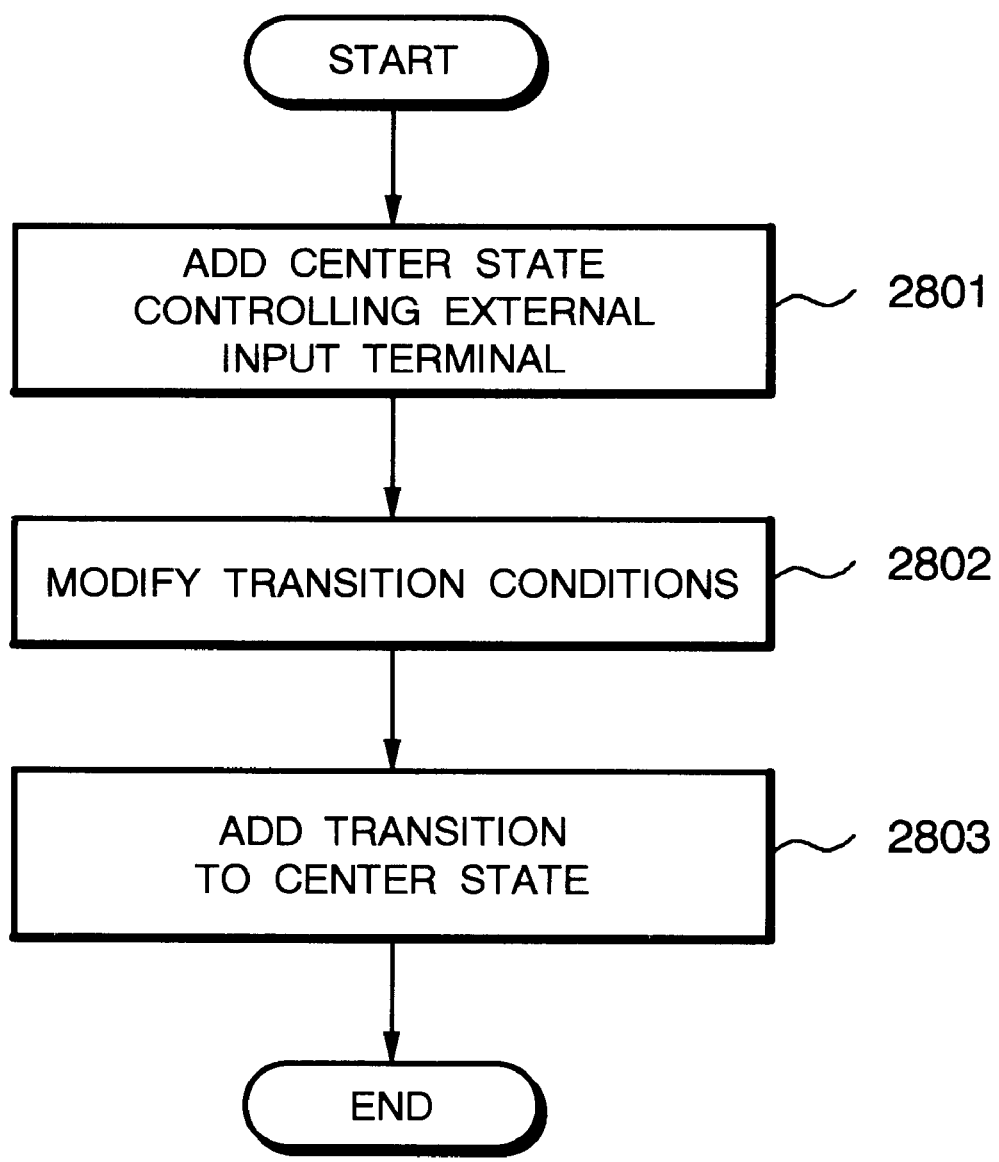
FIG. 28 is a flow chart showing operation of a transition adding unit.
Figure 30:
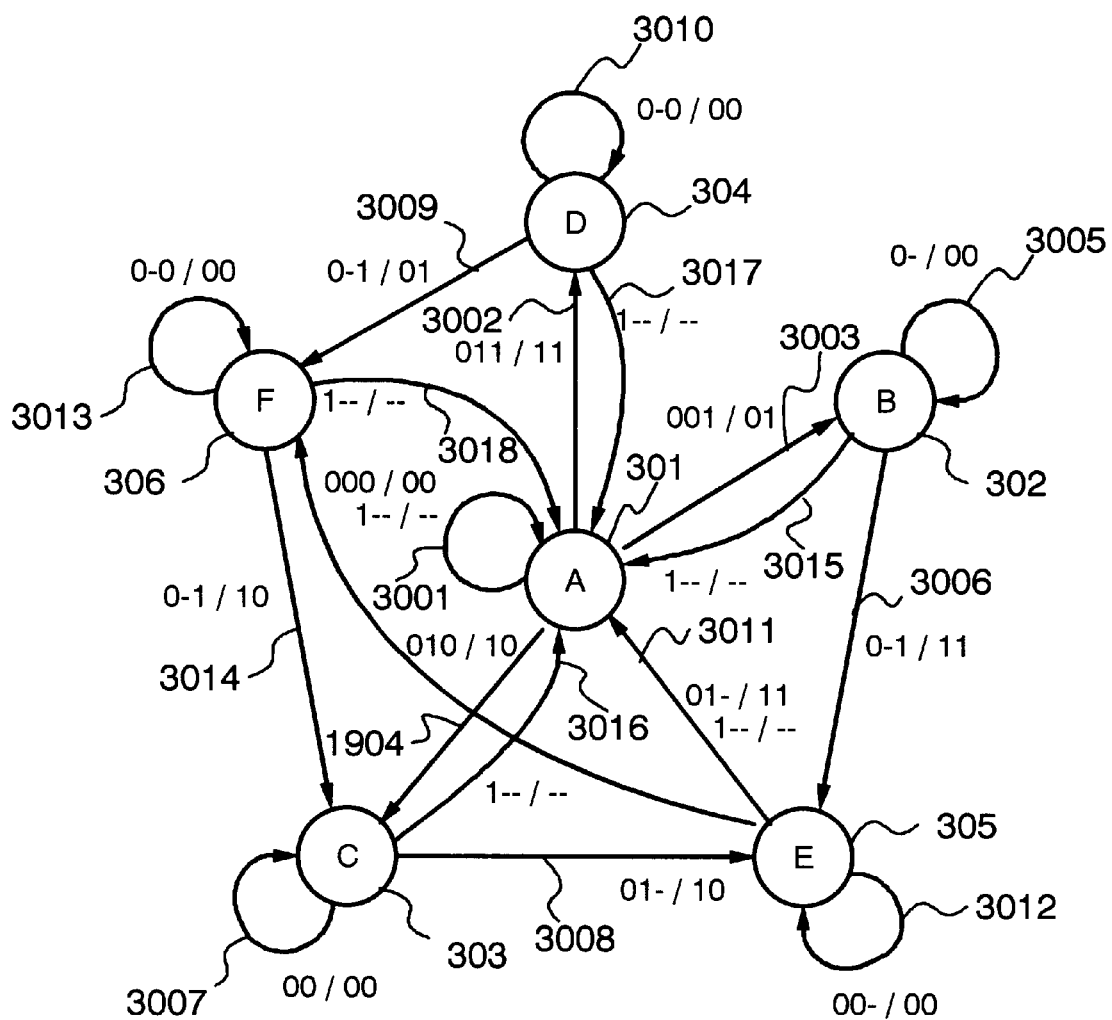
FIG. 30 is a diagram showing a state transition graph of the FSM illustrated in FIG. 29.
Figure 33:
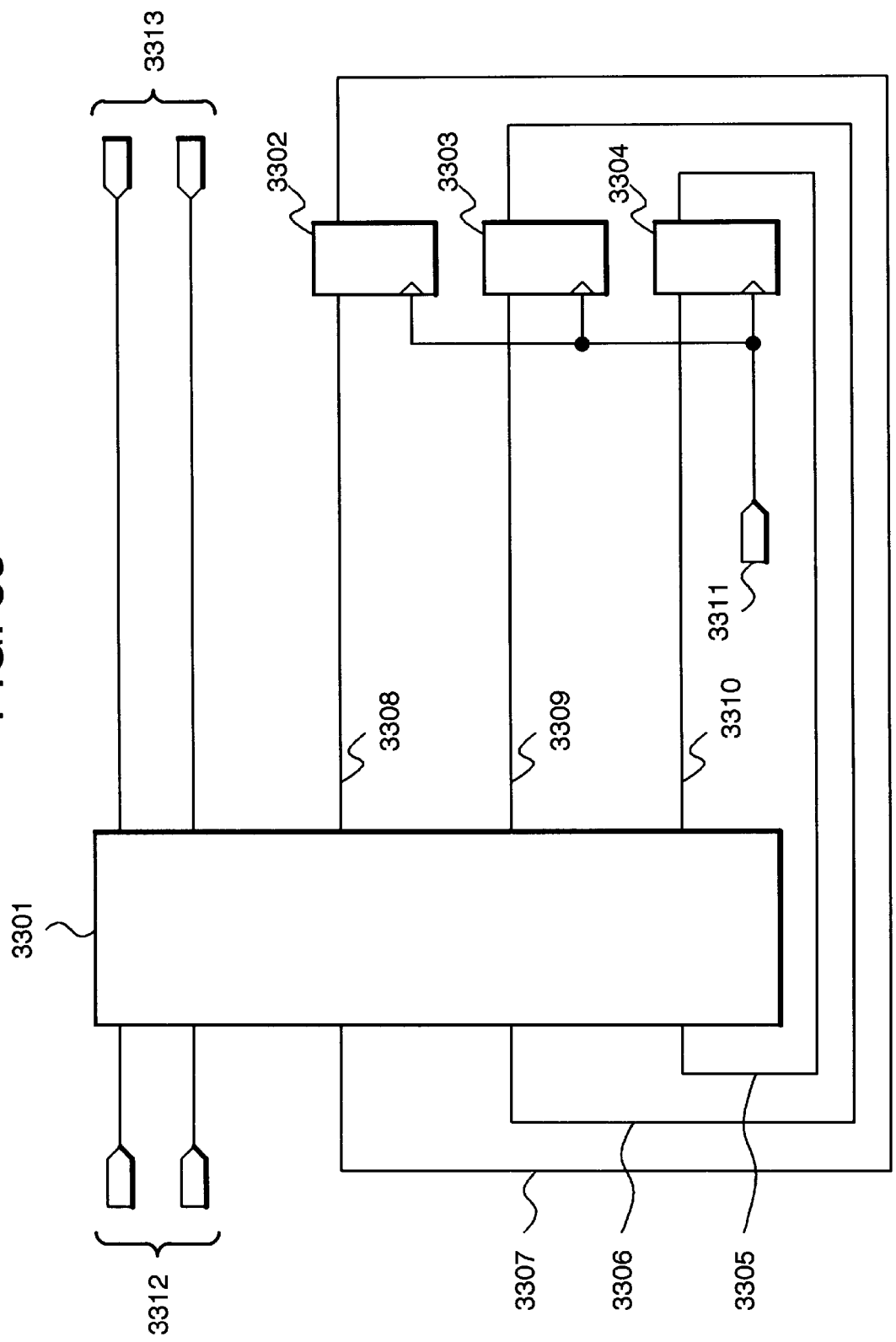
FIG. 33 is a diagram showing a sequential circuit obtained by the application of the processing by a state assignment unit.
Figure 34:
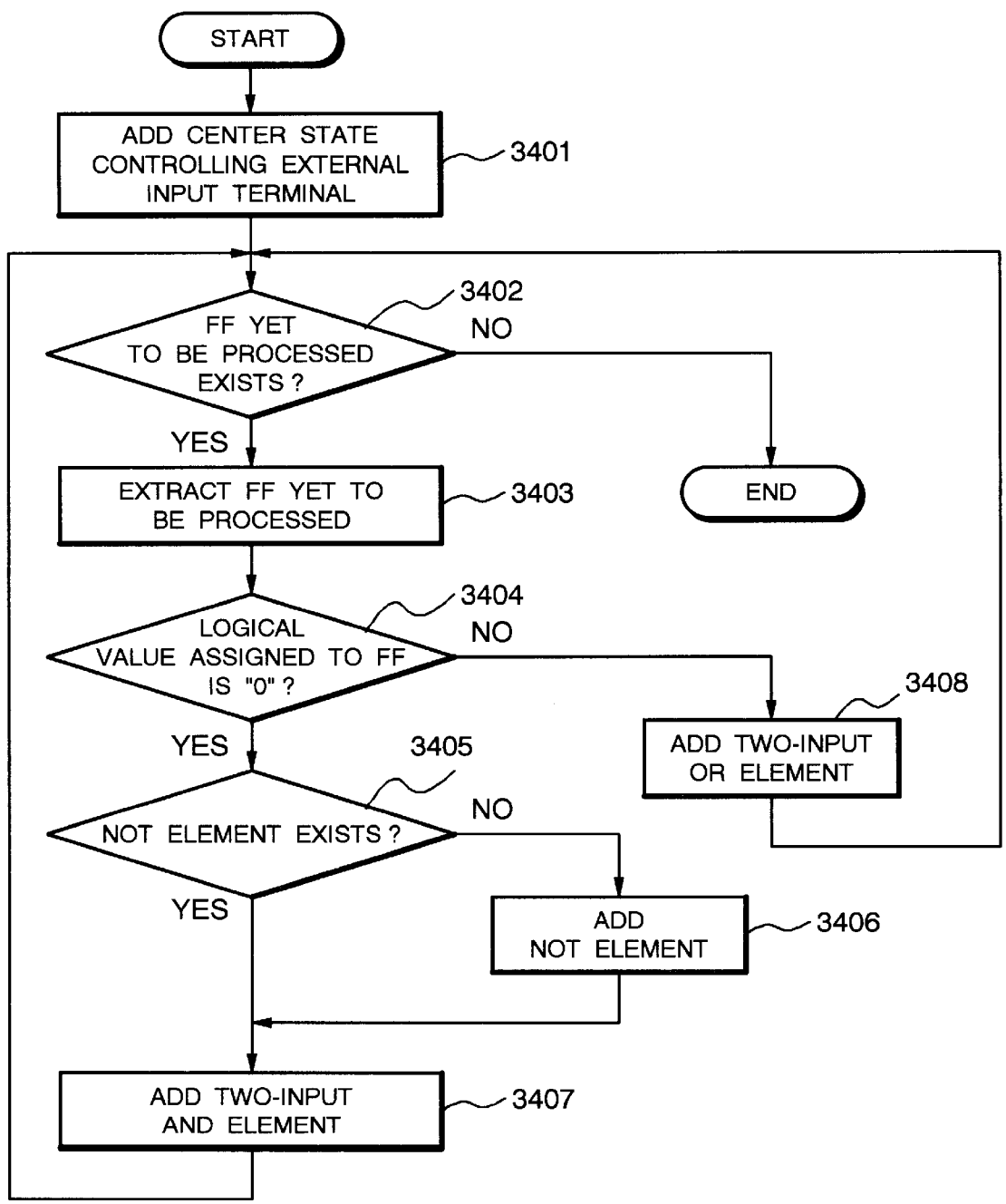
FIG. 34 is a flow chart showing operation of a logic adding unit.
Figure 35:
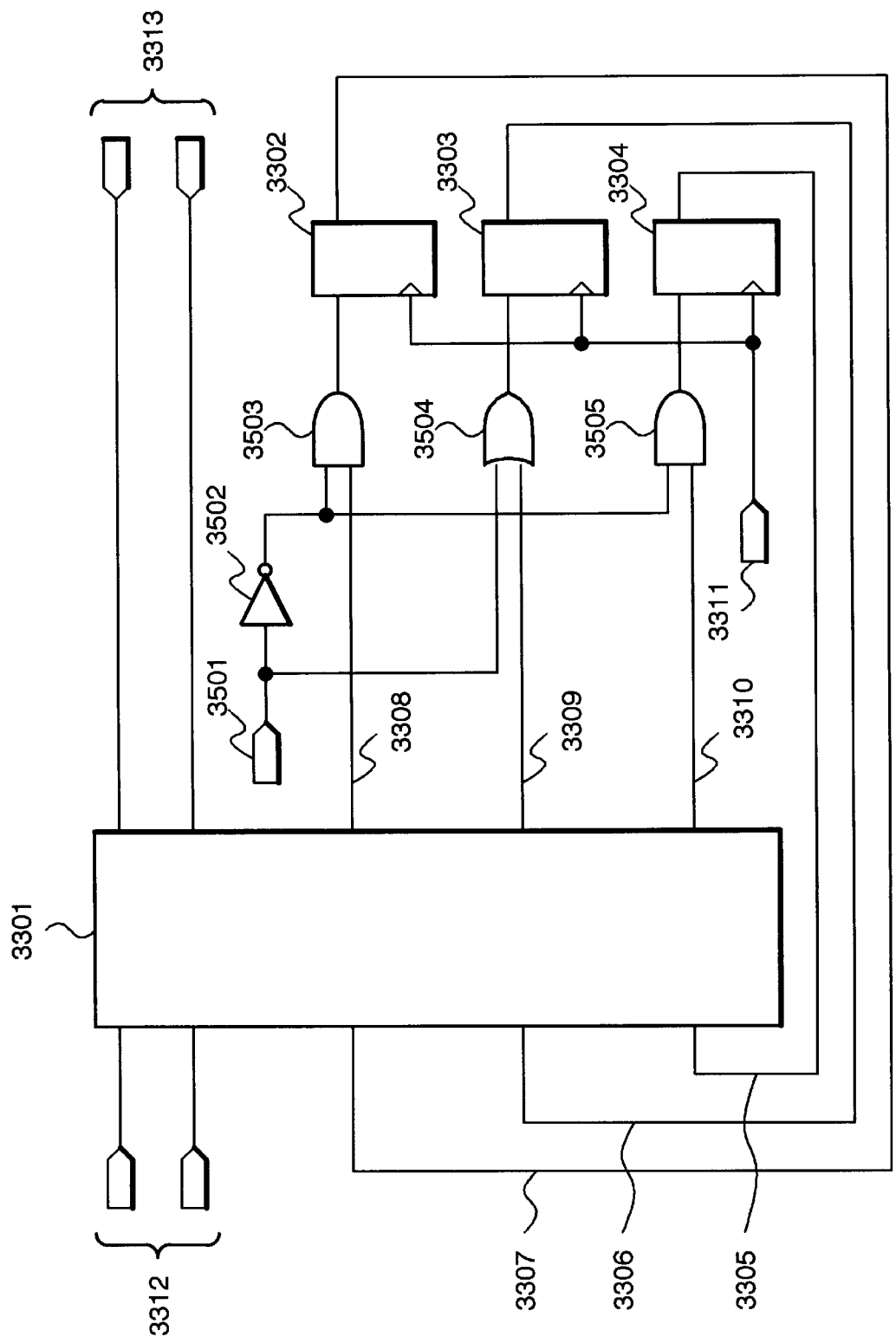
FIG. 35 is a diagram showing a sequential circuit obtained by the application of the processing by the logic adding unit to the sequential circuit of FIG. 33.

FIG. 20 is a flow chart showing operation of the center state candidate selecting unit 111 in detail. With reference to FIG. 20, the center state candidate selecting unit 111 first regards all the states as center state candidates (Step 2001) to determine whether an asynchronous reset state exists (Step 2002). When no asynchronous reset state exists, the routine proceeds to Step 2008 and when it exists, the routine proceeds to Step 2003. Since in the example shown in FIG. 18, an asynchronous reset state exists, the routine proceeds to the processing 2003 to exclude the asynchronous reset state A1801 in question from center state candidates.

Next, the unit 111 obtains a distance from the asynchronous reset state to each of the center state candidates (Step 2004). The A row of FIG. 19 shows results of obtained distances from the asynchronous reset state. Then, the unit 111 sets the number of states excluded to "0" (Step 2005) and compares the designated number of states close to the asynchronous reset state and the number of states excluded (Step 2006). As a result of the comparison, when the designated number and the number of states excluded coincide with each other, the routine proceeds to Step 2008 and when they fail to coincide with each other, the unit 111 excludes a center state candidate closest to the asynchronous reset state and adds "1" to the number of states excluded (Step 2007) to return to Step 2006 to again compare the designated number and the number of states excluded.

Here, since the designated number of states close to the asynchronous reset state is "1" and the number of excluded states is "0", a candidate state with the shortest distance from the asynchronous reset state is excluded from the center state candidates to add "1" to the number of excluded states. In this case, since the state B1802 is closest to the asynchronous reset state, the state B1802 is excluded from the center state candidates. Next, upon returning to Step 2006 to find that the number of states excluded is "1" and that as many state as the designated number has been excluded, the routine proceeds to Step 2008.

Next, the center state candidate selecting unit 111 calculates a sum of distances of each center state candidate state from other states (Step 2008). Then, the unit sets the number of excluded states to "0" (Step 2009) and compares the designated number of states close to other states and the number of states excluded (Step 2010). As a result of the comparison, when the designated number and the number of excluded states coincide with each other, the processing by the center state candidate selecting unit 111 is completed. When they fail to coincide with each other, the unit 111 excludes a center state candidate state closest to other states and after adding "1" to the number of excluded states (Step 2011), returns to Step 2010 to again compare the designated number and the number of excluded states.

Here, since the designated number of states is "1" and the number of excluded states is "0", the unit 111 excludes a candidate state with the shortest distance from other states from center state candidates to add "1" to the number of excluded states. In this case, since the state C1803 is closest to other states, it is excluded from the center state candidates. Next, upon returning to Step 2010 to find that the number of states excluded is "1" and that as many state as the designated number has been excluded, the processing by the center state candidate selecting unit 111 is completed. Completion of the processing by the center state candidate selecting unit 111 results in having states D1804, E1805 and F1806 as center stete candidates.

Next, the center state selecting unit 112 selects a center state among the candidates selected by the center state candidate selecting unit 111. Since details of the operation of the center state selecting unit 112 are the same as those of the above operation example described with reference to FIG. 6, no description will be made thereof. As a result of the processing by the center state selecting unit 112, the state E1805 is selected as the center state.

FIG. 21 is a diagram showing distances between all pairs of states in the FSM illustrated in FIG. 18 obtained as a result of the addition of a Transition from every state to the state E1805 selected as the center state. With reference to FIG. 21, an average value of state-to-state distances is "1.36", which shows a drastic reduction as compared with the average state-to-state distance value of "1.41" obtained as a result of the reduction attained by the above-described conventional art.

As described in the foregoing, the logic synthesis for testability system and the logic synthesis method thereof of the present invention exclude, from center state candidates, an asynchronous reset state to which transition from every state is possible, and a state with a short distance from the asynchronous reset state, that is, a state which will produce little effect of distance reduction because of a path existing via the asynchronous reset state. As a result, selection of these states as center states can be avoided. By excluding an asynchronous reset state and a state with a short distance from the asynchronous reset state from center state candidates, therefore, the system and the method of the present invention enable selection of a center state which can contribute to improvement in testability also of an FSM having an asynchronous rest state.

In addition, the logic synthesis for testability system and the logic synthesis method thereof of the present invention exclude a state with a short distance from other states which will produce little effect of distance reduction from center state candidates. As a result, such a state will not be selected as a center state. By excluding such a state with a short distance from other states from center state candidates, therefore, the system and the method of the present invention enable selection of a center state which is highly effective in improving testability also of an FSM having such a state whose distance from other states is short.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. Logic synthesis for testability system which conducts optimization processing taking testability in logic circuit design using a technology library for use in technology mapping, description of a circuit as a target for logic synthesis and constraints such as area and delay, comprising:
    FSM extracting means for extracting an FSM when said circuit is expressed in other form than FSM;
    testability means for improving testability of said circuit expressed by an FSM by using a center state of an FSM extracted by said FSM extracting means to reduce a distance between predetermined states;
    state assignment means for assigning a binary logical value vector to a state of said circuit expressed by an FSM;
    area optimization means for optimizing an area of said circuit;
    delay optimization means for optimizing a delay of said circuit; and
    circuit outputting means for outputting a circuit as a resultant of logic synthesis of said circuit which is conducted by said testability means, said state assignment means, said area optimization means and said delay optimization means, wherein
    said testability means comprising
        center state candidate selecting means for excluding an asynchronous reset state and a predetermined state with a short distance from the asynchronous reset state from center state candidates,
        center state selecting means for sequentially selecting, as a center state, said states not excluded by said center state candidate selecting means.

2. The logic synthesis for testability system as set forth in claim 1, wherein
    said center state candidate selecting means, when a value of a distance between targeted said state and said asynchronous reset state is smaller than a threshold value set based on predetermined rules, excludes the targeted state from center state candidates.

3. The logic synthesis for testability system as set forth in claim 1, wherein
    said center state candidate selecting means sets a maximum limit of the number of said states to be selected as center state candidates to sequentially select said states as center state candidates within the maximum limit, starting with said state with a long distance from said asynchronous reset state, and exclude the remainder of said states from center state candidates.

4. The logic synthesis for testability system as set forth in claim 1, wherein
    said center state candidate selecting means sets a maximum limit of the number of said states to be excluded from center state candidates to sequentially exclude said states from center state candidates within the maximum limit, starting with said state with a short distance from said asynchronous reset state.

5. The logic synthesis for testability system as set forth in claim 1, wherein
    said center state candidate selecting means excludes, from center state candidates, predetermined said state with a short distance from other said states as well as said asynchronous reset state and predetermined said state with a short distance from the asynchronous reset state.

6. The logic synthesis for testability system as set forth in claim 1, wherein
    with respect to predetermined said state, when a sum of distances between the state and the remainder of said states is smaller than a value obtained by multiplying an average value of distances between the state and the remainder of said states by the number of the remainder of said states, said center state candidate selecting means excludes the predetermined state as well as said asynchronous reset state and predetermined said state with a short distance from the asynchronous reset state from center state candidates.

7. The logic synthesis for testability system as set forth in claim 1, wherein
    said center state candidate selecting means sets a maximum limit of the number of said states to be excluded from center state candidates other than said asynchronous reset state and predetermined said state with a short distance from the asynchronous reset state to sequentially exclude said states from center state candidates within the maximum limit, starting with said state with a short distance from other said state.

8. The logic synthesis for testability system as set forth in claim 1, wherein with respect to predetermined said state, when a value of a distance between the state and each of all other said states is smaller than a threshold value set based on predetermined rules, said center state candidate selecting means excludes the predetermined state as well as said asynchronous reset state and predetermined said state with a short distance from the asynchronous reset state from center state candidates.

9. A method of synthesizing logic of a logic circuit which enables improvement in testability of an FSM by using a center state to reduce state-to-state distances, comprising the steps of:

determining whether an asynchronous reset state exists;

regarding all of said states as center state candidates when the determination is made at said determination step that no asynchronous reset state exists and setting a threshold value based on predetermined rules when the determination is made that an asynchronous reset state exists;

calculating distances between all of said states in said FSM and said asynchronous reset state;

with respect to all of said states in said FSM, judging whether to select targeted said state as a center state candidate based on said state-to-state distance calculating step and a threshold value set at said threshold value setting step.

10. A method of synthesizing logic of a logic circuit as set forth in claim 9, wherein in said threshold value setting step, said threshold value is set according to a distance value from said asynchronous reset state, said center state candidate judging step comprising with respect to all of said states in said FSM, sequentially comparing a distance between each state and said asynchronous reset state calculated at said state-to-state distance calculating step and a threshold value set at said threshold value setting step to determine whether the state-to-state distance is long or short, and when the determination is made at said state-to-state distance determining step that the state-to-state distance is long, selecting targeted said state as a center state candidate.

11. A method of synthesizing logic of a logic circuit as set forth in claim 10, wherein in said threshold value setting step, an average distance value between said asynchronous reset state and each of all other said states is set as said threshold value.

12. A method of synthesizing logic of a logic circuit as set forth in claim 10, wherein in said threshold value setting step, said threshold value is calculated by using a calculation expression employing the number of states.

13. A method of synthesizing logic of a logic circuit as set forth in claim 9, wherein in said threshold value setting step, a maximum limit of the number of said states to be selected as center state candidates is set as said threshold value, said center state candidate judging step sequentially selects said states as said center state candidates within the maximum limit, starting with said state with a long distance from said asynchronous reset state, and exclude the remainder of said states from said center state candidates.

14. A method of synthesizing logic of a logic circuit as set forth in claim 9, wherein in said threshold value setting step, a maximum limit of the number of said states to be excluded from center state candidates is set as said threshold value, said center state candidate judging step sequentially excludes said states from center state candidates within the maximum limit, starting with said state with a short distance from said asynchronous reset state.

15. A method of synthesizing logic of a logic circuit which enables improvement in testability of an FSM by using a center state to reduce state-to-state distances, comprising the steps of:

regarding all of said states as center state candidates to determine whether an asynchronous reset state exists among said states;

when the determination is made at said determination step that an asynchronous reset state exists, excluding the asynchronous reset state from center state candidates and calculating a first threshold value based on predetermined rules;

calculating distances between all of said states as center state candidates and said asynchronous reset state;

with respect to all of said states in said FSM, judging whether to exclude targeted said state as a center state candidate based on said state-to-state distance calculating step and a threshold value set at said first threshold value setting step;

calculating a second threshold value based on predetermined rules, with respect to all of said states as center state candidates, calculating each state-to-state distance;

judging whether to exclude targeted said state as a center state candidate based on said second state-to-state distance calculating step and a threshold value set at said second threshold setting step.

16. A method of synthesizing logic of a logic circuit as set forth in claim 15, wherein in said first judging step, sequentially comparing a distance between each of said states and said asynchronous reset state calculated at said first state-to-state distance calculating step and a threshold value set at said first threshold value setting step to determine whether the state-to-state distance is long or short, and with respect to predetermined said state, when the determination is made at said state-to-state distance determining step that the state-to-state distance is short, excluding the state from center state candidates, in said second judging step, sequentially comparing a distance calculated between each of said states and said asynchronous reset state at said second state-to-state distance calculating step and a threshold value set at said second threshold setting step to determine whether the state-to-state distance is long or short, and with respect to predetermined said state, when the determination is made at said state-to-state distance determining step that the state-to-state distance is short, excluding the state from center state candidates.

17. A method of synthesizing logic of a logic circuit as set forth in claim 15, wherein in said second threshold value setting step, a value obtained by multiplying an average value of distances between the state and each of all other said states by the number of all other said states is set as said second threshold value, said second judging step excludes targeted said state from said center state candidates when a sum of distances between the state and the remainder of said states is smaller than said second threshold value.

18. A method of synthesizing logic of a logic circuit as set forth in claim 15, wherein in said second threshold value setting step, a maximum limit of the number of said states to be excluded from center state candidates is set as said threshold value, said second judging step excludes said states from center state candidates within the maximum limit, starting with said state with a short distance from said asynchronous reset state.

19. A computer readable memory storing a control program for controlling a logic synthesis for testability system which conducts optimization processing taking testability into consideration during designing of a logic circuit to employ a center state of an FSM in said logic circuit, thereby reducing a state-to-state distance to improve testability of the FSM, said control program executable on a computer to perform the steps of:

determining whether an asynchronous reset state exists;

regarding all of said states as center state candidates when the determination is made at said determination step that no asynchronous reset state exists and setting a threshold value based on predetermined rules when the determination is made that an asynchronous reset state exists;

calculating distances between all of said states in said FSM and said asynchronous reset state;

with respect to all of said states in said FSM, judging whether to select a state as a center state candidate based on said state-to-state distance calculating step and a threshold value set at said threshold value setting step.

20. A computer readable memory as set forth in claim 19, wherein said control program further performs the steps of:

setting said threshold value according to a distance value from said asynchronous reset state, sequentially comparing, with respect to all of said states in said FSM, a distance between each state and said asynchronous reset state calculated at said state-to-state distance calculating step and a threshold value set at said threshold value setting step to determine whether the state-to-state distance is long or short, and when the determination is made at said state-to-state distance determining step that the state-to-state distance is long, selecting said state as a center state candidate.

21. A computer readable memory storing a control program for controlling a logic synthesis for testability system which conducts optimization processing taking testability into consideration during designing of a logic circuit to employ a center state of an FSM in said logic circuit, thereby reducing a state-to-state distance to improve testability of the FSM, said control program executable on a computer to perform the steps of:

regarding all of said states as center state candidates to determine whether an asynchronous reset state exists among said states;

when the determination is made at said determination step that an asynchronous reset state exists, excluding the asynchronous reset state from center state candidates and calculating a first threshold value based on predetermined rules;

calculating distances between all of said states as center state candidates and said asynchronous reset state;

with respect to all of said states in said FSM, judging whether to exclude a state as a center state candidate based on said state-to-state distance calculating step and a threshold value set at said first threshold value setting step, calculating a second threshold value based on predetermined rules;

with respect to all of said states as center state candidates, calculating each state-to-state distance;

judging whether to exclude a state as a center state candidate based on said second state-to-state distance calculating step and a threshold value set at said second threshold setting step.

22. A computer readable memory as set forth in claim 21, wherein said control program further performs the steps of:

in said first judging step, sequentially comparing a distance between each of said states and said asynchronous reset state calculated at said first state-to-state distance calculating step and a threshold value set at said first threshold value setting step to determine whether the state-to-state distance is long or short, and when the determination is made at said state-to-state distance determining step that the state-to-state distance is short, excluding the state from center state candidates, and in said second judging step, sequentially comparing a distance calculated between each of said states and said asynchronous reset state at said second state-to-state distance calculating step and a threshold value set at said second threshold setting step to determine whether the state-to-state distance is long or short, and when the determination is made at said state-to-state distance determining step that the state-to-state distance is short, excluding the state from being a center state candidate.

* * * * *